US011011541B2

(12) United States Patent
Nakatsuka et al.

(10) Patent No.: US 11,011,541 B2
(45) Date of Patent: May 18, 2021

(54) SEMICONDUCTOR MEMORY DEVICE IN WHICH MEMORY CELLS ARE THREE-DIMENSIONALLY ARRANGE

(71) Applicant: TOSHIBA MEMORY CORPORATION, Tokyo (JP)

(72) Inventors: Keisuke Nakatsuka, Kobe Hyogo (JP); Fumitaka Arai, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,389

(22) Filed: Sep. 3, 2019

(65) Prior Publication Data
US 2020/0303403 A1 Sep. 24, 2020

(30) Foreign Application Priority Data

Mar. 22, 2019 (JP) .............................. JP2019-054118

(51) Int. Cl.
| | |
|---|---|
| *H01L 27/11582* | (2017.01) |
| *H01L 27/11556* | (2017.01) |
| *H01L 23/528* | (2006.01) |
| *G11C 16/14* | (2006.01) |
| *G11C 16/10* | (2006.01) |
| *G11C 16/04* | (2006.01) |
| *H01L 27/11519* | (2017.01) |
| *H01L 27/11565* | (2017.01) |
| *G11C 16/26* | (2006.01) |

(52) U.S. Cl.
CPC .... *H01L 27/11582* (2013.01); *G11C 16/0483* (2013.01); *G11C 16/10* (2013.01); *G11C 16/14* (2013.01); *G11C 16/26* (2013.01); *H01L 23/528* (2013.01); *H01L 27/11519* (2013.01); *H01L 27/11556* (2013.01); *H01L 27/11565* (2013.01); *G11C 2216/14* (2013.01); *G11C 2216/18* (2013.01)

(58) Field of Classification Search
CPC ............ H01L 27/11582; H01L 23/521; H01L 27/11556; G11C 16/10; G11C 16/26; G11C 2216/14; G11C 2216/18
See application file for complete search history.

(56) References Cited

U.S. PATENT DOCUMENTS

| | | | |
|---|---|---|---|
| 8,310,875 B2 | 11/2012 | Sakurai | |
| 8,952,426 B2 * | 2/2015 | Maejima | ........... H01L 27/11573 257/214 |
| 9,286,984 B2 | 3/2016 | Lee | |
| 9,502,299 B2 | 11/2016 | Hishida | |
| 2010/0207195 A1 * | 8/2010 | Fukuzumi | .......... G11C 16/0483 257/326 |
| 2018/0240806 A1 * | 8/2018 | Sawa | ................ H01L 27/11519 |
| 2020/0294554 A1 * | 9/2020 | Kakegawa | ............. G11C 5/063 |

* cited by examiner

*Primary Examiner* — Tuan T Nguyen
(74) *Attorney, Agent, or Firm* — Foley & Lardner LLP

(57) ABSTRACT

A semiconductor memory device includes a first block and a second block arranged adjacent to each other in a Y direction. Each of the first and second blocks includes conductive layers extended in an X direction, memory trenches between the conductive layers, memory pillars provided across two conductive layers with a memory trench interposed therebetween, and transistors provided between the memory pillars and the conductive layers. One of the conductive layers provided at an end of the first block in the Y direction is electrically connected to one of the conductive layers provided at an end of the second block.

10 Claims, 19 Drawing Sheets

SEMICONDUCTOR MEMORY DEVICE IN WHICH MEMORY CELLS ARE THREE-DIMENSIONALLY ARRANGE

CROSS-REFERENCE TO RELATED APPLICATION(S)

This application is based upon and claims the benefit of priority from. Japanese Patent Application No. 2019-054118, filed Mar. 22, 2019, the entire contents of which are incorporated herein by reference.

FIELD

Embodiments described herein relate generally to a semiconductor memory device.

BACKGROUND

A semiconductor memory device in which memory cells are three-dimensionally arranged is known.

Examples of related art include JP-A-2015-176910.

DETAILED DESCRIPTION

Figure 1:
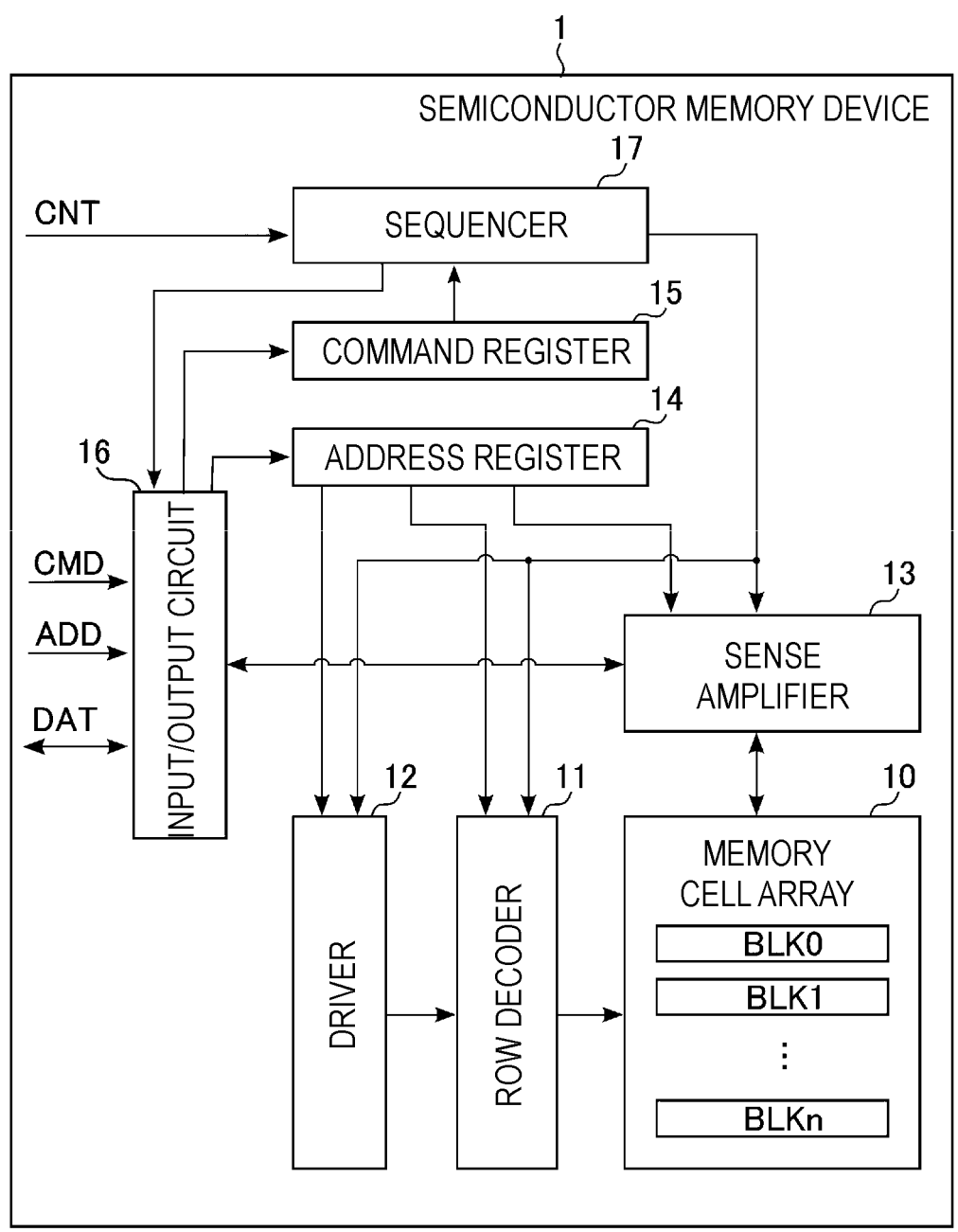
FIG. 1 is a block diagram illustrating a circuit configuration of a semiconductor memory device according to an embodiment.

Embodiments provide a semiconductor memory device of which an operation reliability may be improved.

In general, according to one embodiment, in a semiconductor memory device including a first block and a second block each including a plurality of memory cell transistors and arranged adjacent to each other in a first direction, each of the first and second blocks includes a plurality of first conductive layers that extend in a second direction orthogonal to the first direction and are arranged in the first direction, a plurality of first insulating layers that are provided among the first conductive layers and extend in a third direction orthogonal to both of the first and second directions, a plurality of first pillars that are provided across two first conductive layers with a first insulating layer interposed therebetween, extend in the third direction, and are arranged in the second direction, and a plurality of first transistors that are provided between the first pillars and the first conductive layers. A first conductive layer provided at one end of the first block in the first direction is electrically connected to a first conductive layer provided at the other end of the first block in the first direction.

Hereinafter, embodiments will be described with reference to the accompanying drawings. In the following descriptions, components having a similar function or configuration will be denoted by the same reference numerals. In addition, each embodiment to be described hereinafter is an example of a device or a method for embodying the technical idea of the present disclosure, and does not limit materials, shapes, structures, arrangements and others of components to those described in the embodiment.

Each functional block may be implemented as hardware, computer software or a combination thereof. The respective functional blocks may not be necessarily discriminated as in the examples described hereinafter. For example, some functions may be executed by other functional blocks than the functional blocks in the examples. Further, the functional blocks of the examples may be divided into detailed functional sub-blocks. Herein, a three-dimensional stacking-type NAND flash memory in which memory cell transistors are stacked above a semiconductor substrate will be described as an example of the semiconductor memory device. In the descriptions herein, the memory cell transistors may be referred to as memory cells.

1. First Embodiment

Hereinafter, a semiconductor memory device of a first embodiment will be described.

1.1 Circuit Block Configuration of Semiconductor Memory Device

First, a circuit block configuration of the semiconductor memory device of the first embodiment will be described.

The semiconductor memory device of the first embodiment is a NAND type flash memory capable of storing data in a nonvolatile manner.

FIG. 1 is a block diagram illustrating a circuit configuration of the semiconductor memory device of the first embodiment. A semiconductor memory device 1 includes a memory cell array 10, a row decoder 11, a driver 12, a sense amplifier 13, an address register 14, a command register 15, an input/output circuit 16, and a sequencer 17. In addition, for example, an external device (e.g., a host device or a controller) (not illustrated) is connected to the semiconductor memory device 1 via an external NAND bus.

1.1.1 Configuration of Each Block

The memory cell array 10 includes multiple blocks BLK0, BLK1, BLK2, . . . , and BLKn (n is an integer more than or equal to 0). Each of the multiple blocks BLK0 to BLKn includes multiple memory cell transistors associated with rows and columns. Each of the memory cell transistors is able to store data in a nonvolatile manner, and electrically rewrite data. In the memory cell array 10, multiple word lines, multiple bit lines, a source line and others are provided to control voltages applied to the memory cell transistors. Hereinafter, a block BLK refers to each of the blocks BLK0 to BLKn. Details of the memory cell array 10 and the block BLK will be described later.

The row decoder 11 receives a row address from the address register 14 and decodes the row address. The row decoder 11 selects one of the blocks BLK based on the result of the decoding of the row address, and further selects a word line in the selected block BLK. Further, the row decoder 11 transfers multiple voltages necessary for a write operation, a read operation, and an erase operation to the memory cell array 10.

The driver 12 supplies multiple voltages to the selected block BLK via the row decoder 11.

The sense amplifier 13 detects and amplifies data read from a memory cell transistor into a bit line when data is read. Further, the sense amplifier 13 transfers write data DAT to a bit line when data is written.

The address register 14 stores an address ADD received from, for example, an external device. The address ADD includes a block address that specifies a block BLK of an operation target, and a page address that specifies a word line of an operation target in the specified block. The command register 15 stores a command CMD received from an external device. The command CMD includes, for example, a write command that instructs the sequencer 17 to perform a write operation, and a read command that instructs the sequencer 17 to perform a read operation.

The input/output circuit 16 is connected to an external device via multiple input/output lines (DQ lines). The input/output circuit 16 receives the command CMD and the address ADD from the external device. The input/output circuit 16 transmits the received command CMD to the command register 15, and transmits the received address ADD to the address register 14. Further, the input/output circuit 16 transmits/receives data DAT with the external device.

The sequencer 17 receives a control signal CNT from an external device. The control signal CNT includes a chip enable signal CEn, a command latch enable signal CLE, an address latch enable signal ALE, a write enable signal WEn, a read enable signal REn, and others. The "n" appended to a signal name indicates that the signal is a low active signal.

The sequencer 17 controls the operation of the semiconductor memory device 1 based on the command CMD stored in the command register 15 and the control signal CNT. Specifically, the sequencer 17 controls the row decoder 11, the driver 12, and the sense amplifier 13 based on a write command received from the command register 15, to perform a write into multiple memory cell transistors specified in the address ADD. Further, the sequencer 17 controls the row decoder 11, the driver 12, and the sense amplifier 13 based on a read command received from the command register 15, to perform a read from multiple memory cell transistors specified in the address ADD.

1.1.2 Circuit Configuration of Memory Cell Array 10

Next, a circuit configuration of the memory cell array 10 will be described. As described above, the memory cell array 10 includes the multiple blocks BLK0 to BLKn. Here, a circuit configuration of one block BLK is described, and a circuit configuration of each of the other blocks is the same.

Figure 2:
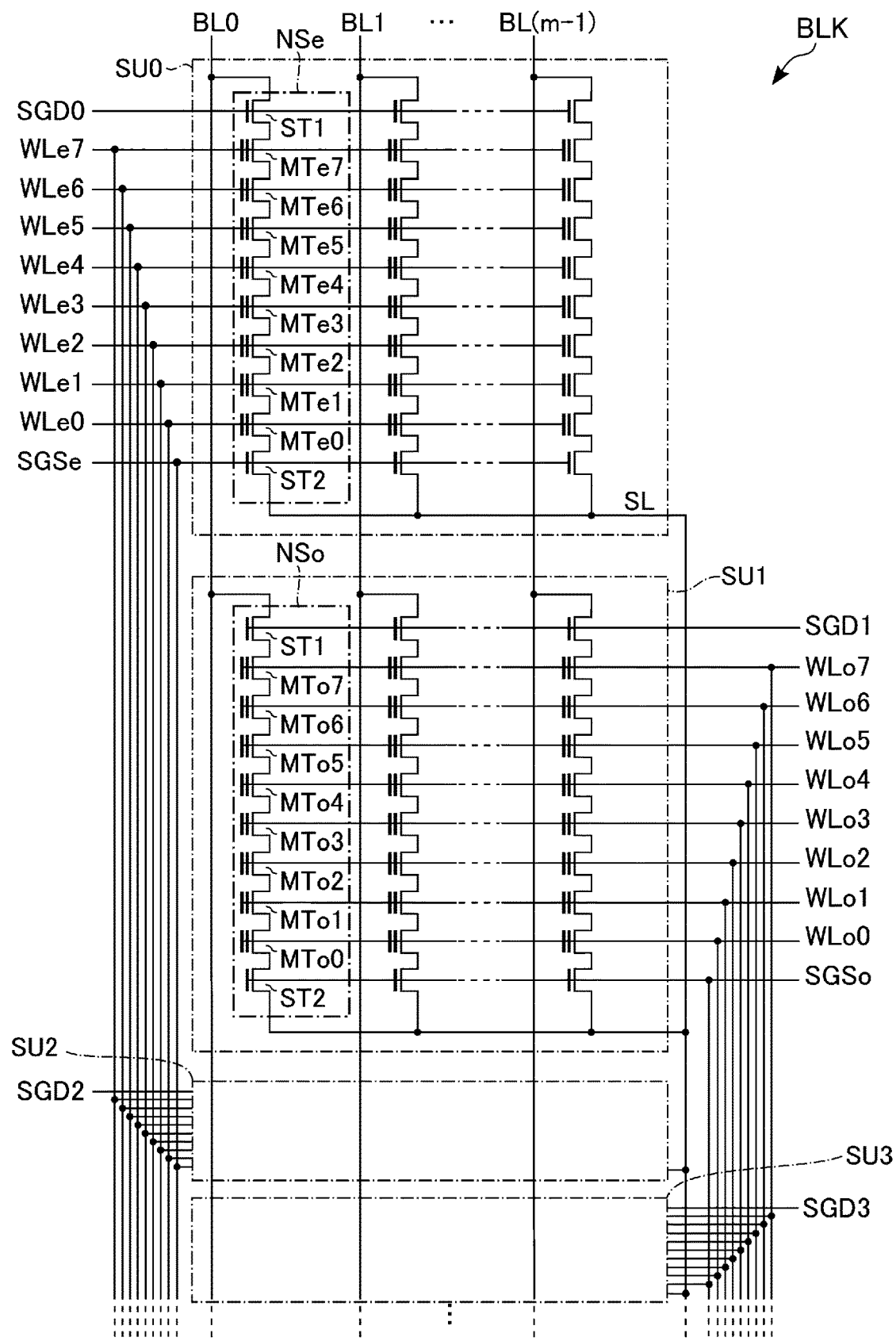
FIG. 2 is a circuit diagram of a block in a memory cell array according to an embodiment.

FIG. 2 is a circuit diagram of one block BLK in the memory cell array 10. The block BLK includes multiple string units. Here, a case where the block BLK includes string units SU0, SU1, SU2, . . . , and SU7 will be described as an example. Each of the string units SU0 to SU7 corresponds to one page which is, for example, a write unit. FIG. 2 illustrates the string units SU0 to SU3. In addition, the number of string units in the block BLK may be set as desired. Hereinafter, a string unit SU refers to each of the string units SU0 to SU7.

The string units SU0 to SU7 include the even-numbered string units SU0, SU2, SU4, and SU6 and the odd-numbered string units SU1, SU3, SU5, and SU7. Hereinafter, each of the even-numbered string units SU0, SU2, SU4, and SU6 will be denoted by SUe, and each of the odd-numbered string units SU1, SU3, SU5, and SU7 will be denoted by SUo.

The even-numbered string unit SUe includes multiple NAND strings NSe. The odd-numbered string unit SUo includes multiple NAND strings NSo. In addition, when the NAND strings NSe and NSo are individually referred-to without being discriminated from each other, each NAND string will be referred to as a NAND string NS.

The NAND string NS includes, for example, eight memory cell transistors MT0, MT1, MT2, . . . , and MT7, and select transistors ST1 and ST2. Here, a case where the NAND string NS includes eight memory cell transistors is described as an example, but the number of memory cell transistors in the NAND string NS may be set as desired.

Each of the memory cell transistors MT0 to MT7 includes a control gate and a charge storage layer, and stores data in a nonvolatile manner. The memory cell transistors MT0 to MT7 are connected in series between the source of the select transistor ST1 and the drain of the select transistor ST2. The memory cell transistor MT may be of a metal-oxide-nitride-oxide-silicon (MONOS) type using an insulating film as the charge storage layer, or a floating gate (FG) type using a conductive layer as the charge storage layer. Hereinafter, a memory cell transistor MT refers to each of the memory cell transistors MT0 to MT7.

The gates of the select transistors ST1 in the respective string units SU0 to SU7 are connected to select gate lines SGD0, SGD1, SGD2, . . . , and SGD7, respectively. Each of the select gate lines SGD0 to SGD7 is independently controlled by the row decoder 11.

The gate of the select transistor ST2 in each of the even-numbered string units SU0, SU2, . . . , and SU6 is connected to, for example, a select gate line SGSe. The gate of the select transistor ST2 in each of the odd-numbered string units SU1, SU3, . . . , and SU7 is connected to, for example, a select gate line SGSo. For example, the select gate lines SGSe and SGSo may be connected to each other to be the same wire, or may be separate wires.

In addition, the control gates of the memory cell transistors MT0 to MT7 in the string units SUe of the same block BLK are connected to word lines WLe0, WLe1, WLe2, ..., and WLe7, respectively. Meanwhile, the control gates of the memory cell transistors MT0 to MT7 in the string units SUo of the same block BLK are connected to word lines WLo0, WLo1, WLo2, ..., and WLo7, respectively. Each of the word lines WLe0 to WLe7 and WLo0 to WLo7 is independently controlled by the row decoder 11.

The block BLK is, for example, an erase unit of data. That is, data stored in the memory cell transistors MT in the same block BLK are collectively erased. In addition, data may be erased in the unit of the string unit SU or in the unit smaller than the string unit SU.

In addition, the drains of the select transistors ST1 of the NAND strings NS in the same column in the memory cell array 10 are connected to each corresponding bit line of bit lines BL0 to BL (m−1). Here, m is a natural number more than or equal to 1. That is, each of the bit lines BL0 to BL(m−1) commonly connects the NAND strings NS to each other among the multiple string units SU. In addition, the sources of the multiple select transistors ST2 are connected to a source line SL.

That is, the string unit SU includes the multiple NAND strings NS which are connected to the different bit lines BL and connected to the same select gate line SGD. In addition, the block BLK includes the multiple string units SUe which share the word lines WLe and the multiple string units SUo which share the word lines WLo. In addition, the memory cell array 10 includes the multiple blocks BLK which share the bit lines BL.

In the memory cell array 10, the select gate lines SGS, the word lines WL, and the select gate lines SGD are stacked in an order above the semiconductor substrate, so as to form the memory cell array 10 in which the select transistors ST2, the memory cell transistors MT, and the select transistors ST1 are three-dimensionally stacked.

In addition, the memory cell array 10 may have other configurations. That is, the configuration of the memory cell array 10 is described in, for example, U.S. patent application Ser. No. 12/407,403 filed on Mar. 19, 2009 and entitled "THREE DIMENSIONAL STACKED NONVOLATILE SEMICONDUCTOR MEMORY." Further, the configuration of the memory cell array 10 is described in U.S. patent application Ser. No. 12/406,524 filed on Mar. 18, 2009 and entitled "THREE DIMENSIONAL STACKED NON-VOLATILE SEMICONDUCTOR MEMORY," U.S. patent application Ser. No. 12/679,991 filed on Mar. 25, 2010 and entitled "NON-VOLATILE SEMICONDUCTOR STORAGE METHOD AND METHOD OF MANUFACTURING THE SAME," and U.S. patent application Ser. No. 12/532,030 filed on Mar. 23, 2009 and entitled "SEMICONDUCTOR MEMORY AND METHOD FOR MANUFACTURING SAME." These patent applications are hereby incorporated by reference in their entirety.

1.2 Layout and Structure of Semiconductor Memory Device

Next, a layout and a structure of the semiconductor memory device of the first embodiment will be described.

1.2.1 Overall Layout of Semiconductor Memory Device

Figure 3:
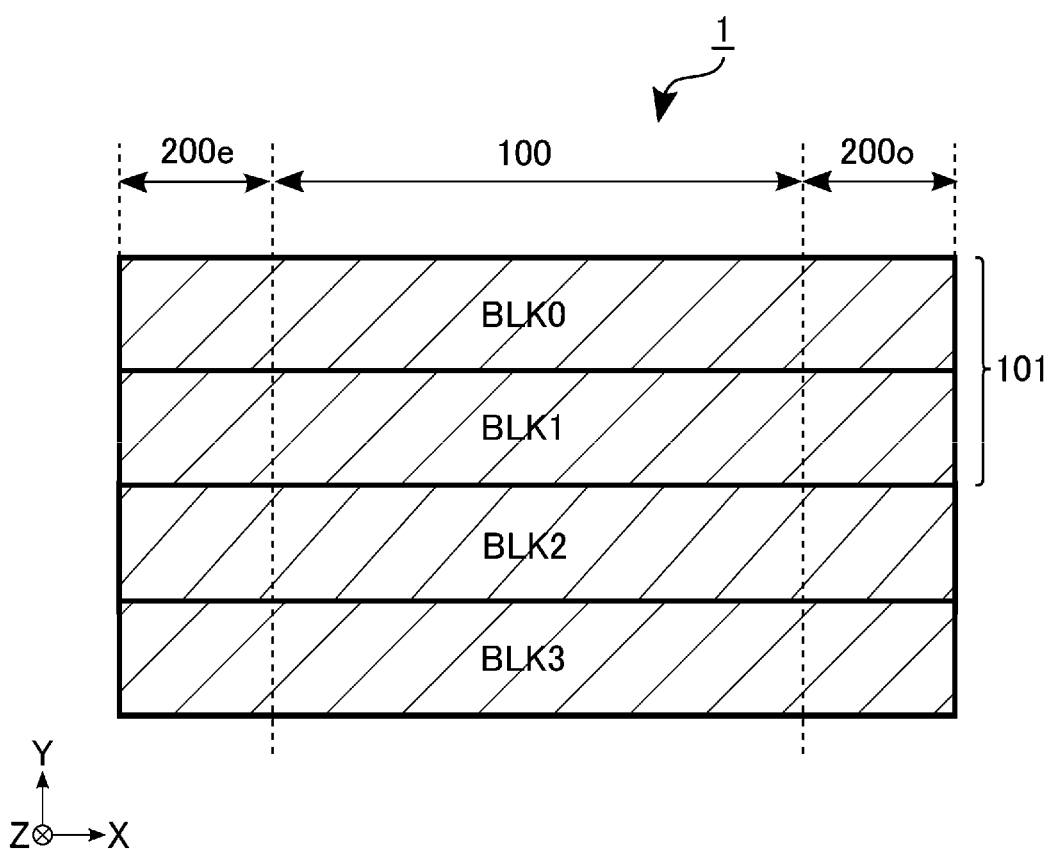
FIG. 3 is a schematic view of a layout of a semiconductor memory device according to an embodiment.

FIG. 3 is a schematic view of a layout of the semiconductor memory device of the first embodiment. In FIG. 3 and the subsequent figures, the two directions which are orthogonal to each other while being in parallel with the surface of the semiconductor substrate are defined as an X direction and a Y direction, respectively, and the direction orthogonal to a plane including the X direction and the Y direction (XY plane) is defined as a Z direction (a stacking direction).

The semiconductor memory device 1 includes a memory array area 100 and hookup areas 200e and 200o. The hookup areas 200e and 200o are disposed at both ends of the memory array area 100 in the X direction such that the memory array area 100 is interposed between the hookup areas 200e and 200o in the X direction. That is, the hookup area 200e is disposed at one end of the memory array area 100 in the X direction, and the hookup area 200o is disposed at the other end of the memory array area 100 in the X direction.

The memory array area 100 includes the multiple blocks BLK, and FIG. 3 represents the blocks BLK0 to BLK3. The blocks BLK0 to BLK3 are arranged in an order in the Y direction.

1.2.1.1 Layout of Memory Array Area and Hookup Areas

Figure 4:
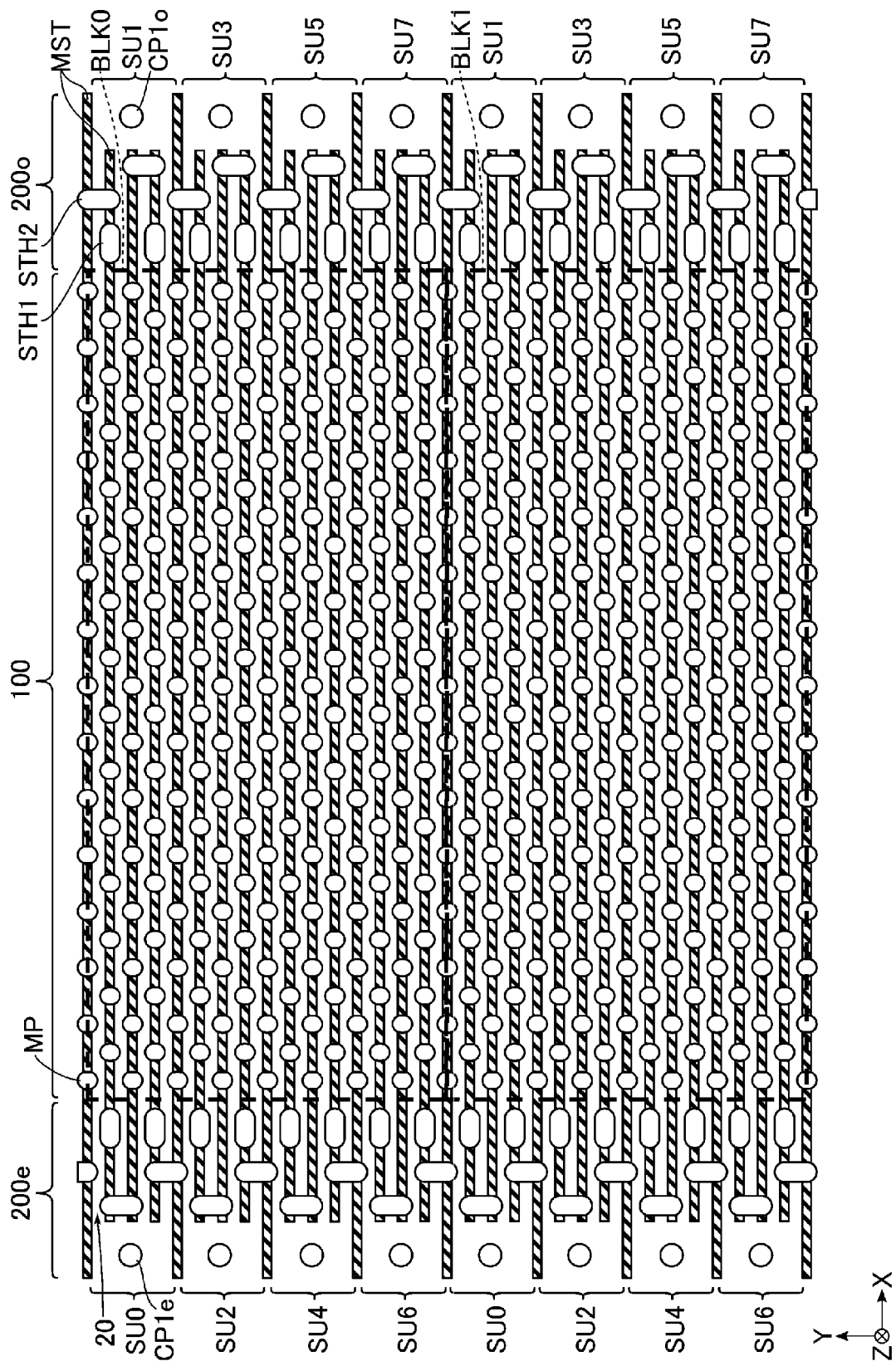
FIG. 4 is a plan view illustrating a portion of a memory array area and hookup areas according to an embodiment.

Next, details of a portion of the memory array area 100 and the hookup areas 200e and 200o in the semiconductor memory device 1 will be described. FIG. 4 is an enlarged view of an area 101 in FIG. 3, and is a plan view illustrating a portion of the memory array area 100 and the hookup areas 200e and 200o.

As illustrated in FIG. 4, the memory array area 100 is provided, and the hookup areas 200e and 200o are provided at one end and the other end of the memory array area 100, respectively. In the memory array area 100, for example, the two blocks BLK0 and BLK1 are represented. The blocks BLK0 and BLK1 are arranged in the Y direction.

As described above, each of the blocks BLK0 and BLK1 includes the string units SU0 to SU7. The extensions of the select gate lines SGD0, SGD2, SGD4, and SGD6 and the word lines WLe (not illustrated) of the string units SU0, SU2, SU4, and SU6, that is, the string units SUe are provided in the hookup area 200e. Contact plugs CP1e connect the select gate lines SGD0, SGD2, SGD4, and SGD6, respectively, to an upper layer wire (not illustrated).

The extensions of the select gate lines SGD1, SGD3, SGD5, and SGD7 and the word lines WLo (not illustrated) of the string units SU1, SU3, SU5, and SU7, that is, the string units SUo are provided in the hookup area 200o. Contact plugs CP1o connect the select gate lines SGD1, SGD3, SGD5, and SGD7, respectively, to an upper layer wire (not illustrated).

The string unit SU includes multiple memory trenches MST, multiple memory pillars MP, multiple select gate lines SGD (not illustrated), and multiple word lines WL (not illustrated). Each memory trench MST extends in the X direction, and the multiple memory trenches MST are arranged at predetermined intervals in the Y direction. Each memory trench MST is an insulating area and includes, for example, a silicon oxide layer.

The multiple pillars MP are arranged at predetermined intervals in the X direction, on each memory trench MST. Assuming that two adjacent memory trenches MST are a first memory trench and a second memory trench, the memory pillars MP arranged on the second memory trench are disposed at positions shifted by half pitch from the memory pillars MP arranged on the first memory trench. In other words, the multiple memory pillars MP are arranged in a staggered manner in the X direction and the Y direction.

A conductive layer 20 is provided between adjacent memory trenches MST. The conductive layers 20 include conductive layers 20-0 to 20-15 to be described later. The conductive layers 20 are connected to each other in the hookup area 200e or 200o, and correspond to the select gate lines SGD. The layout of the select gate lines SGD and the word lines WL will be described in detail later.

In the hookup areas 200e and 200o, areas STH1 are provided on the memory trenches MST. The areas STH1 are alternately arranged on the memory trenches MST arranged in the Y direction. Each area STH1 is an area where an insulating material is embedded in a hole used in a replacement process for forming the conductive layers (the word lines and the select gate lines) to be described later. Each area STH1 is, for example, an insulating layer such as a silicon oxide layer.

In the hookup areas 200e and 200o, areas STH2 are provided on the memory trenches MST and the conductive layers 20. The areas STH2 are arranged in a staggered manner in the Y direction. Each area STH2 is an area where an insulating material is embedded in a hole used in a replacement process for forming the conductive layers (the word lines and the select gate lines) to be described later, and is an area that isolates the conductive layers 20 into the select gate lines SGDe and SGDo in alternate and insulating manners. Each area STH2 is an insulating layer and includes, for example, a silicon oxide layer.

In addition, in the hookup areas 200e and 200o, contact plugs are provided to be connected to the multiple stacked word lines, respectively, although omitted here.

1.2.1.2 Cross-Sectional Structure of Memory Cell Array

Figure 5:
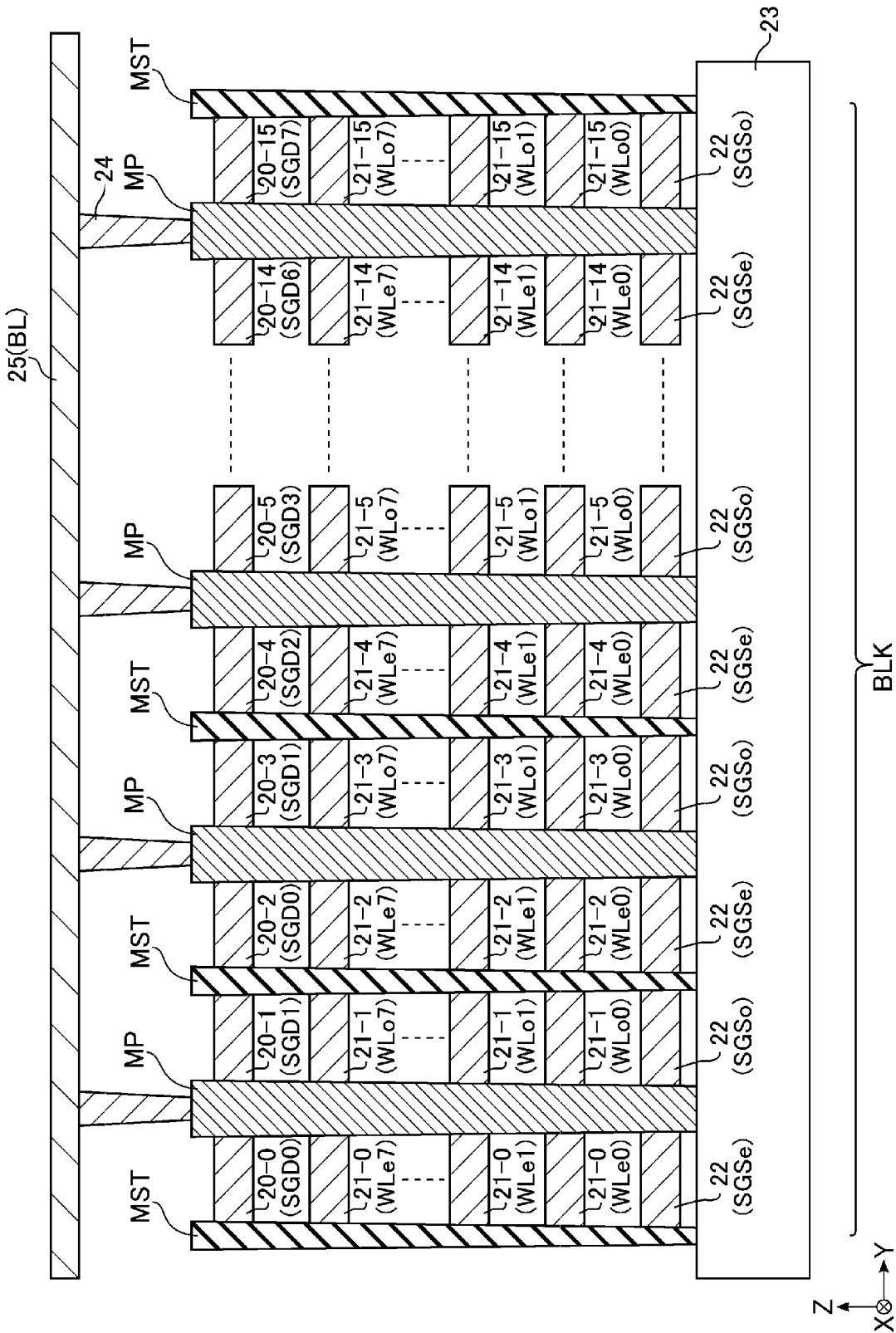
FIG. 5 is a cross-sectional view of a block which is taken along a Y direction according to an embodiment.

Next, a cross-sectional structure of a block BLK in the memory cell array 10 will be described. FIG. 5 is a cross-sectional view of a block BLK which is taken along the Y direction. In addition, the insulating layers between the conductive layers and on the conductive layers are omitted.

As illustrated in FIG. 5, conductive layers 22 are provided above a semiconductor substrate (e.g., a p-type well area) 23. The conductive layers 22 function as the select gate lines SGSe and SGSo. Eight conductive layers 21 are stacked above the conductive layers 22 along the Z direction. Each conductive layer 21 includes conductive layers 21-0 to 21-15, and the eight conductive layers 21 function as the word lines WLe0 to WLe7 or WLo0 to WLo7.

The conductive layers 20 are provided above the conductive layers 21. The conductive layers 20 include the conductive layers 20-0 to 20-15, and function as the select gate lines SGD0 to SGD7. A planar layout of the conductive layers 20 and 21 will be described later.

A memory trench MST and a memory pillar MP are alternately provided in the Y direction, to reach the semiconductor substrate 23 from the conductive layers 20. As described above, the memory trench MST is an insulating layer. A contact plug or the like may be provided in the memory trench MST to apply a voltage to an area provided in the semiconductor substrate 23. For example, a contact plug may be provided to connect the source of the select transistor ST2 to an upper layer wire (not illustrated).

The conductive layers 22 are arranged such that a memory trench MST or a memory pillar MP is interposed between the conductive layers 22, and alternately function as the select gate lines SGSe and SGSo. Similarly, the conductive layers 21 are arranged such that a memory trench MST or a memory pillar MP is interposed between the conductive layers 21, and alternately function as the word lines WLe and WLo.

In addition, a memory trench MST is also provided between the blocks BLK adjacent to each other in the Y direction. A contact plug or the like may be provided in the memory trench MST to apply a voltage to an area provided in the semiconductor substrate 23. For example, a contact plug may be provided to connect the source of the select transistor ST2 to an upper layer wire.

A contact plug 24 is provided on each memory pillar MP. In addition, a conductive layer 25 is provided on the contact plugs 24 along the Y direction. The conductive layer 25 functions as a bit line BL.

In addition, the cross section of the block BLK which is taken along the X direction will be described below.

Figure 6:
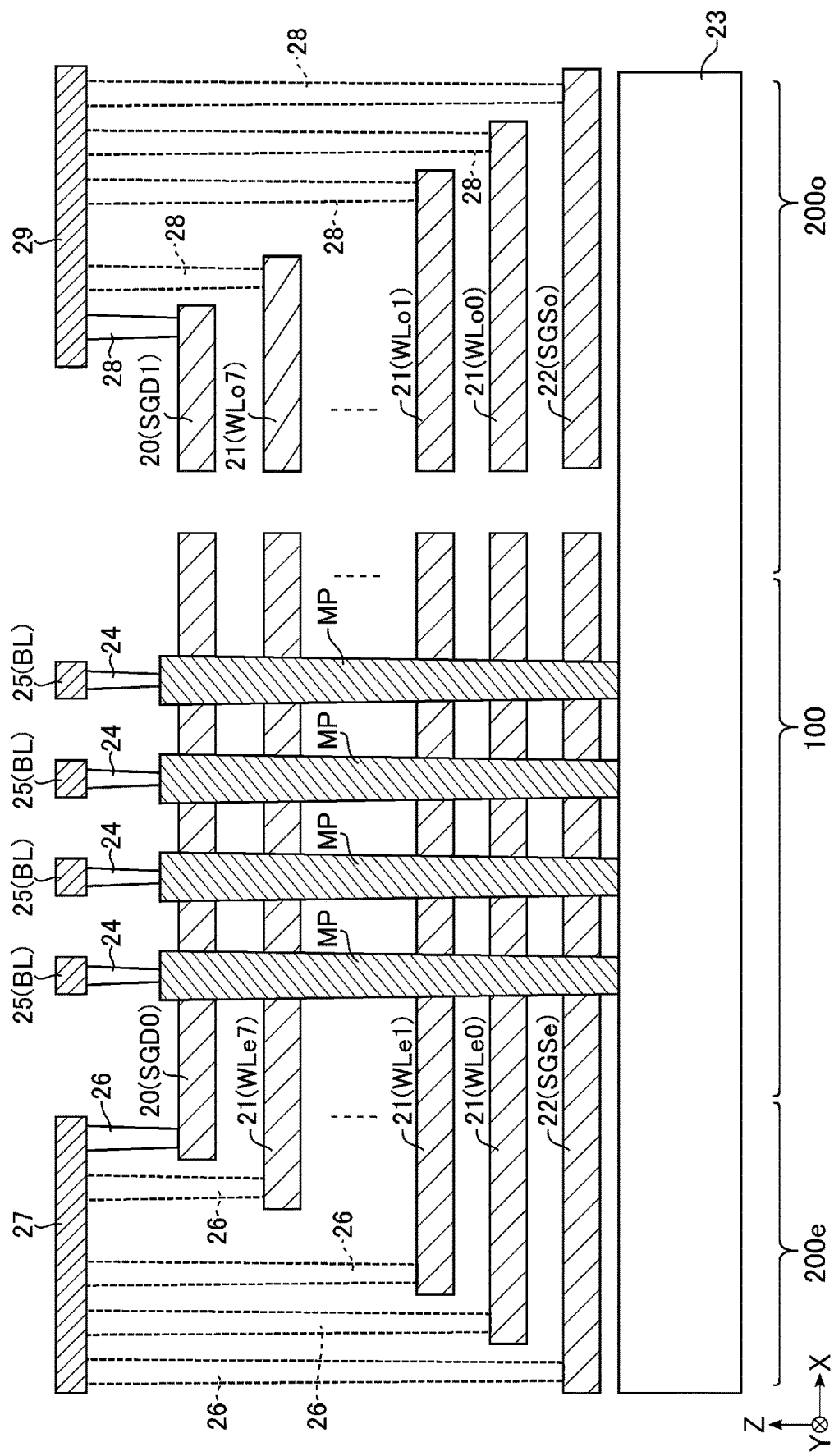
FIG. 6 is a cross-sectional view of a block which is taken along an X direction according to an embodiment.

FIG. 6 is a cross-sectional view of the block BLK which is taken along the X direction, and represents a cross-sectional structure of an area that passes through the memory pillars MP along the select gate line SGD0 in FIG. 4, as an example. In addition, the insulating layers between the conductive layers and on the conductive layers are omitted.

As described above using FIG. 5, the conductive layers 22, 21, and 20 are provided in an order above the semiconductor substrate 23. In addition, the memory array area 100 is the same as described above using FIG. 5.

As illustrated in FIG. 6, in the hookup area 200e, the conductive layers 20 to 22 extend, for example, in a step-like manner. That is, in the hookup area 200e, each of the conductive layers 20 to 22 has a terrace portion which does not overlap with a conductive layer higher than the corresponding conductive layer, when viewed in the XY plane. A contact plug 26 is provided on the terrace portion. In addition, the contact plug 26 is connected to a conductive layer 27. The contact plug 26 and the conductive layer 27 contain, for example, a metal such as tungsten (W).

The conductive layers 20 to 22 that function as the even-numbered select gate lines SGD0, SGD2, SGD4, and SGD6, the even-numbered word lines WLe, and the even-numbered select gate lines SGSe are electrically connected to the row decoder 11 by the conductive layer 27.

Meanwhile, in the hookup area 200o, similarly, the conductive layers 20 to 22 extend in a step-like manner. That is, in the hookup area 200o, each of the conductive layers 20 to 22 has a terrace portion which does not overlap with a conductive layer higher than the corresponding conductive layer, when viewed in the XY plane. A contact plug 28 is provided on the terrace portion. In addition, the contact plug 28 is connected to a conductive layer 29. The contact plug 28 and the conductive layer 29 contain, for example, a metal such as tungsten (W).

The conductive layers 20 to 22 that function as the odd-numbered select gate lines SGD1, SGD3, SGD5, and SGD7, the odd-numbered word lines WLo, and the odd-numbered select gate lines SGSo are electrically connected to the row decoder 11 by the conductive layer 29.

1.2.1.3 Cross-Sectional Structure of Memory Pillar MP

Figure 7:
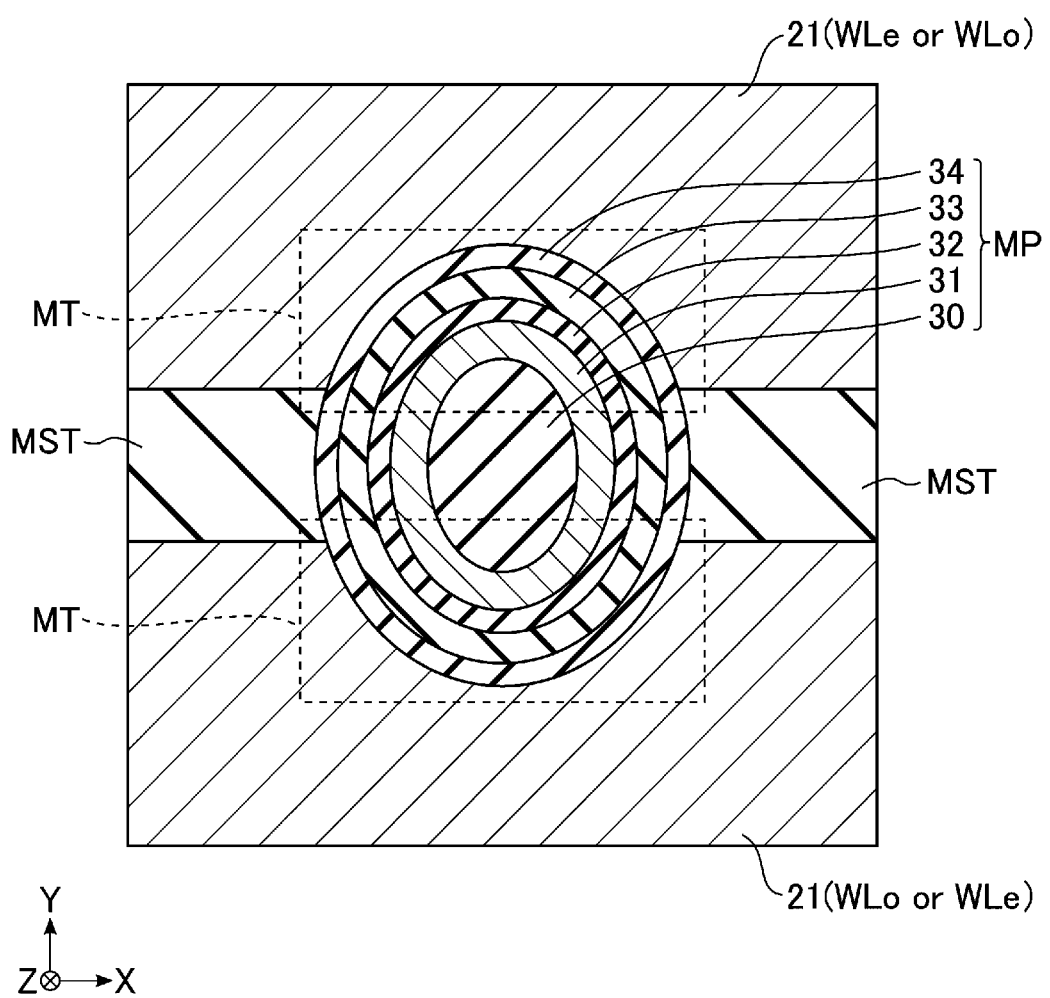
FIG. 7 is a cross-sectional view of a memory pillar which is taken along an XY plane according to an embodiment.
Figure 8:
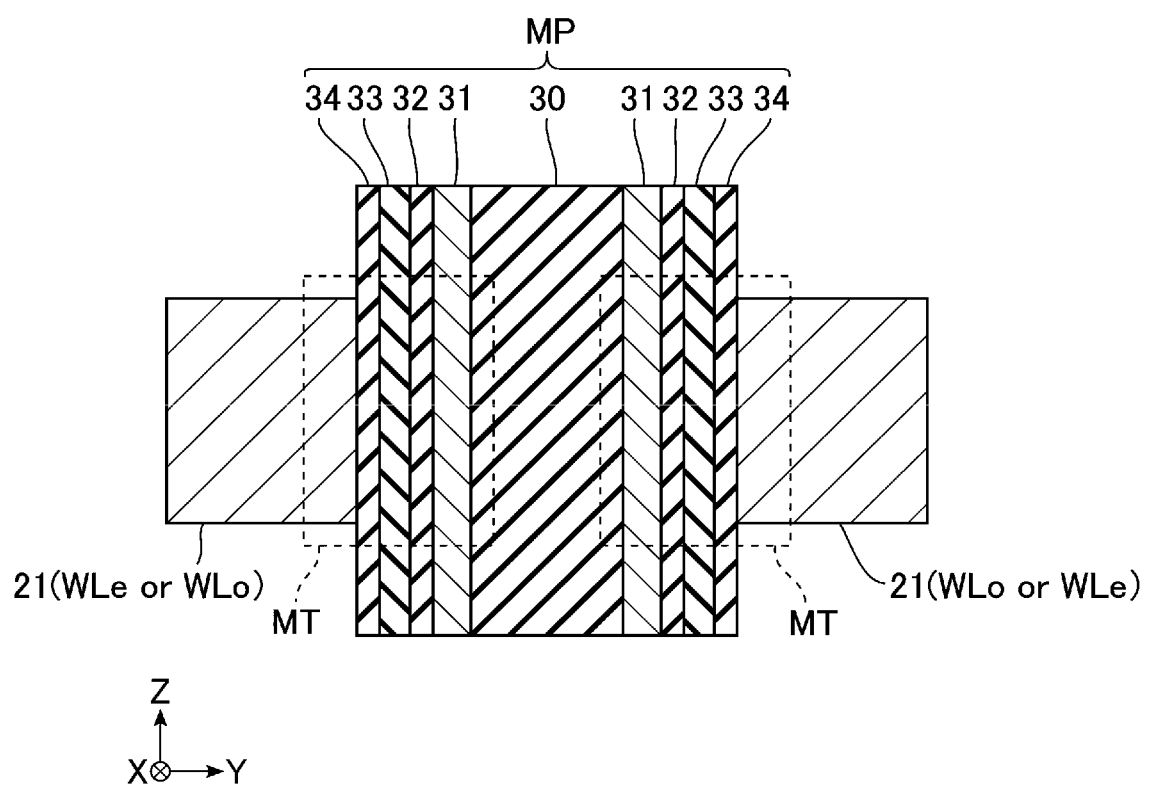
FIG. 8 is a cross-sectional view of a memory pillar which is taken along a YZ plane according to an embodiment.

Next, descriptions will be made on a structure and equivalent circuits of a memory pillar MP and memory cell transistors MT. FIG. 7 is a cross-sectional view of a memory pillar MP which is taken along the XY plane. FIG. 8 is a cross-sectional view of a memory pillar MP which is taken along the YZ plane. In particular, each of FIGS. 7 and 8 represents an area where two memory cell transistors MT are provided.

As illustrated in FIGS. 7 and 8, the memory pillar MP includes an insulating layer 30, a semiconductor layer 31, and insulating layers 32 to 34. The word lines WLe and WLo include the conductive layers 21.

Each of the insulating layer 30, the semiconductor layer 31, and the insulating layers 32 to 34 is provided to extend along the Z direction. The insulating layer 30 is, for example, a silicon oxide layer. The semiconductor layer 31 is provided to surround the side surface of the insulating layer 30. The semiconductor layer 31 functions as an area where a channel of a memory cell transistor MT is formed. The semiconductor layer 31 is, for example, a polycrystalline silicon layer.

The insulating layer 32 is provided to surround the side surface of the semiconductor layer 31. The insulating layer 32 functions as a gate insulating film of a memory cell transistor MT. The insulating layer 32 has a structure in which, for example, a silicon oxide layer and a silicon nitride layer are stacked. The insulating layer 33 is provided to surround the side surface of the insulating layer 32. The insulating layer 33 functions as a charge storage layer of a memory cell transistor MT. The insulating layer 33 is, for example, a silicon nitride layer. The insulating layer 34 is provided to surround the side surface of the insulating layer 33. The insulating layer 34 functions as a block insulating film of a memory cell transistor MT. The insulating layer 34 is, for example, a silicon oxide layer. An insulating layer such as, for example, a silicon oxide layer is embedded in the memory trench MST excluding the portion of the memory pillar MP.

According to the configuration described above, two memory cell transistors MT are provided in one memory pillar MP along the Y direction, to be provided in the conductive layers 21, respectively. Each of the select transistors ST1 and ST2 has the same configuration.

Figure 9:
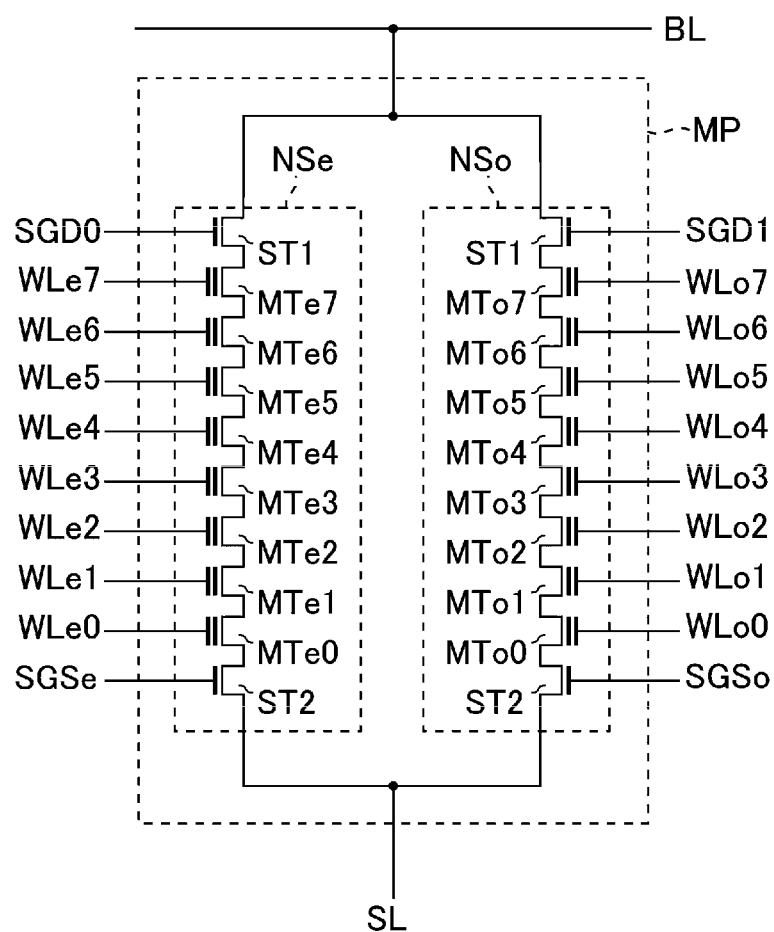
FIG. 9 is an equivalent circuit diagram of a memory pillar according to an embodiment.

In addition, hereinafter, equivalent circuits of the memory pillar MP will be described. FIG. 9 is an equivalent circuit diagram of the memory pillar MP. As illustrated, two NAND strings NSe and NSo are formed in one memory pillar MP. That is, the two select transistors ST1 provided in one memory pillar MP are connected to different select gate lines SGD, and the memory cell transistors MTe0 to MTe7 and MTo0 to MTo7 are connected to different word lines WLe and WLo, respectively. In addition, the select transistors ST2 are also connected to different select gate lines SGSe and SGSo.

The two NAND strings NSe and NSo in the memory pillar MP are connected to the same bit line BL and further connected to the same source line SL. In addition, the two NAND strings NSe and NSo provided in the memory pillar MP share a back gate (the semiconductor layer 31).

1.2.1.4 Configuration of Block Boundary in Memory Array Area and Hookup Areas

Next, the configuration of the boundary of the blocks BLK in the memory array area according to the first embodiment will be described using the boundary of the blocks BLK0 and BLK1 as an example. The configuration of the boundary between the other blocks BLK is similar to that of the boundary between the blocks BLK0 and BLK1.

Figure 10:
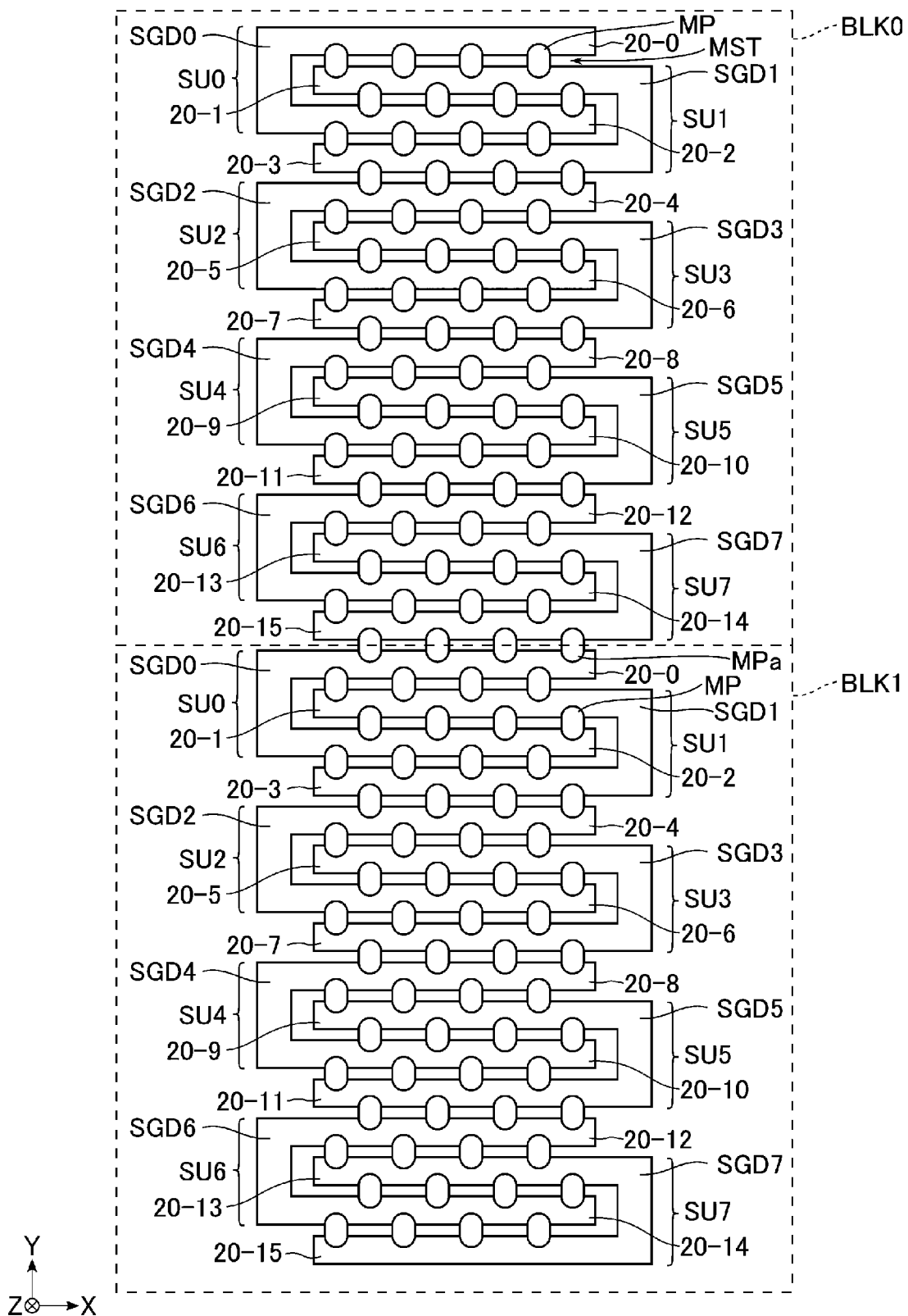
FIG. 10 is a planar layout of memory pillars arranged in a block and select gate lines connected to the memory pillars according to a first embodiment.

First, the configuration of the select gate lines SGD in the blocks BLK0 and BLK1 will be described. FIG. 10 is a planar layout of the memory pillars MP arranged in the blocks BLK0 and BLK1 and the select gate lines SGD0 to SGD7 connected to the memory pillars MP.

As illustrated in FIG. 10, the blocks BLK0 and BLK1 are arranged adjacent to each other in the Y direction. Each of the blocks BLK0 and BLK1 includes the multiple memory pillars MP and the select gate lines SGD0 to SGD7. The multiple memory pillars MP are arranged in a staggered manner in the X direction and the Y direction. The select gate lines SGD0 to SGD7 extend in the X direction and are arranged in the Y direction.

Hereinbelow, the configuration of each of the blocks BLK0 and BLK1 will be described.

As illustrated in FIG. 10, the sixteen conductive layers 20-0 to 20-15 that extend in the X direction are arranged along the Y direction. The conductive layers 20-0 and 20-2 are electrically connected to each other at one end in the X direction, and function as the select gate line SGD0. The conductive layers 20-1 and 20-3 are electrically connected to each other at the other end in the X direction, and function as the select gate line SGD1. Similarly, the conductive layers 20-4 and 20-6 are electrically connected to each other at one end in the X direction, and function as the select gate line SGD2. The conductive layers 20-5 and 20-7 are electrically connected to each other at the other end in the X direction, and function as the select gate line SGD3. The conductive layers 20-8 and 20-10 are electrically connected to each other at one end in the X direction, and function as the select gate line SGD4. The conductive layers 20-9 and 20-11 are electrically connected to each other at the other end in the X direction, and function as the select gate line SGD5. The conductive layers 20-12 and 20-14 are electrically connected to each other at one end in the X direction, and function as the select gate line SGD6. The conductive layers 20-13 and 20-15 are electrically connected to each other at the other end in the X direction, and function as the select gate line SGD7. Each of the select gate lines SGD0 to SGD7 is connected to an upper layer wire (not illustrated) via a contact plug in the hookup areas, and is further connected to the row decoder 11.

In the block BLK0 (or BLK1), the conductive layers 20 adjacent to each other in the Y direction are spaced from each other by a memory trench MST. The memory trench MST is an area filled with, for example, an insulating material. The memory trench MST can be extended from the surface of the semiconductor substrate up to the layer in which the conductive layers 20 are provided.

In addition, multiple memory pillars MP are arranged at predetermined intervals in the X direction on the memory trench MST between the conductive layers 20 adjacent to each other in the Y direction. Each memory pillar MP extends along the Z direction on the memory trenches MST and the conductive layers. Specifically, the multiple memory pillars MP are provided between the conductive layers 20-0 and 20-1, between the conductive layers 20-1 and 20-2, between the conductive layers 20-2 and 20-3, . . . , and between the conductive layers 20-14 and 20-15. Each memory pillar MP is a columnar body that includes the memory cell transistors MT and the select transistors ST1 and ST2. The details of the memory pillar MP will be described later.

Hereinbelow, the configuration of the boundary of the blocks BLK0 and BLK1 will be described.

As illustrated in FIG. 10, the blocks BLK0 and BLK1 are arranged adjacent to each other in the Y direction. In the boundary of the blocks BLK0 and BLK1, the conductive layer 20-15 of the block BLK0 and the conductive layer 20-0 of the block BLK1 are disposed. A memory trench MST is disposed between the conductive layers 20-15 and 20-0. In addition, multiple memory pillars MPa are arranged at predetermined intervals in the X direction on the memory trench MST between the conductive layers 20-15 and 20-0. The memory pillars MPa are equivalent to the other memory pillars MP.

The portions where the conductive layer 20-15 (i.e., the select gate line SGD7) of the block BLK0 intersects with the memory pillars MPa operate as the select transistors in the block BLK0. In addition, the portions where the conductive layer 20-0 (i.e., the select gate line SGD0) of the block BLK1 intersects with the memory pillars MPa operate as the select transistors of the block BLK1.

Figure 11:
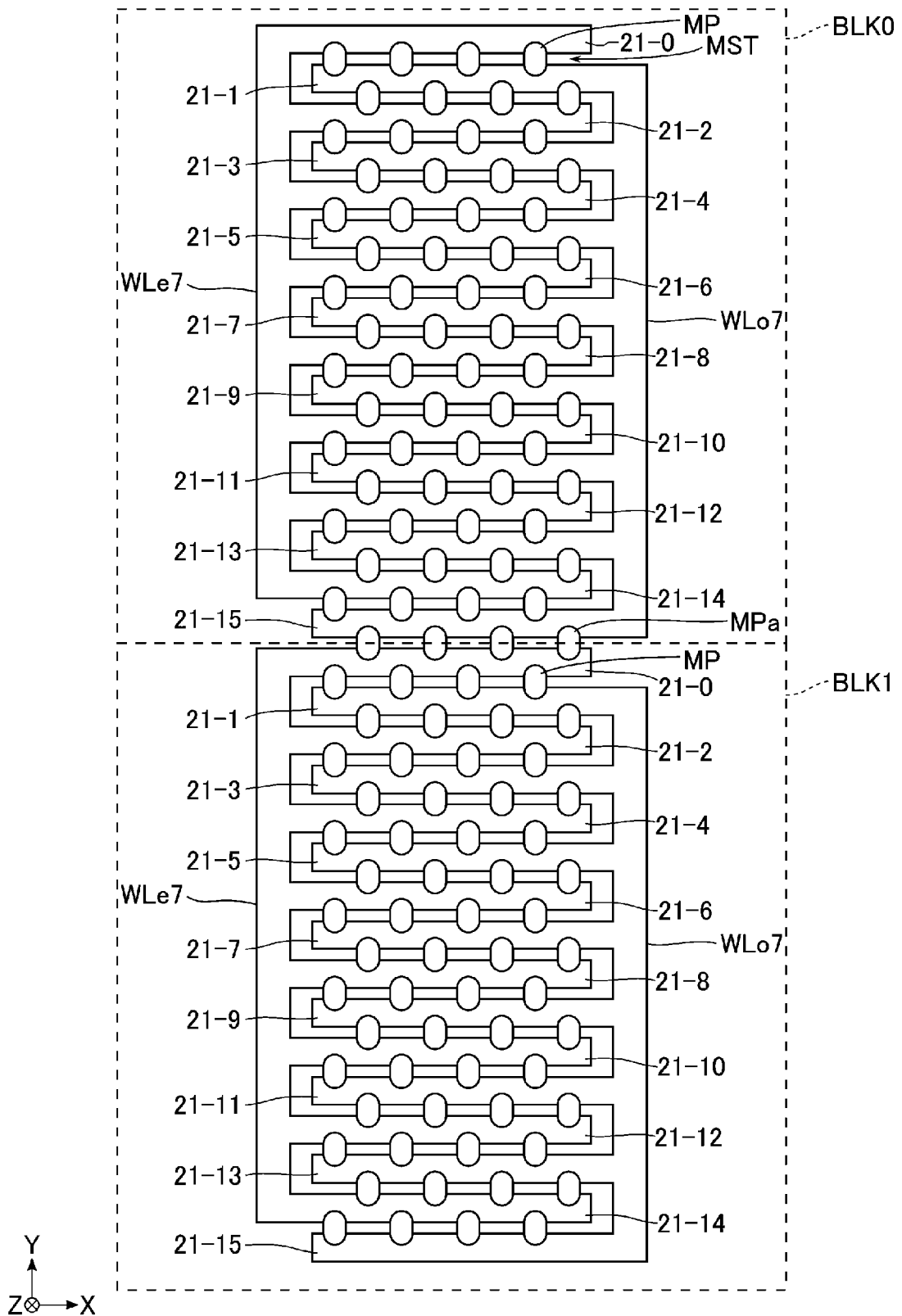
FIG. 11 is a planar layout of memory pillars arranged in a block and word lines connected to the memory pillars according to the first embodiment.

Next, the configuration of the word lines WL in the blocks BLK0 and BLK1 will be described. FIG. 11 is a planar layout of the memory pillars MP arranged in the blocks BLK0 and BLK1 and the word lines WLe7 and WLo7 connected to the memory pillars MP. Here, the word lines WLe7 and WLo7 will be described as an example. The word lines WLe7 and WLo7 are provided below the select gate lines SGD0 to SGD7. The word lines WLe6 to WLe0 are provided below the word line WLe7, and the word lines WLo6 to WLo0 are provided below the word line WLo7. The configuration of each of the word lines WLe6 to WLe0 is similar to that of the word line WLe7, and the configuration of each of the word lines WLo6 to WLo0 is similar to that of the word line WLo7.

As illustrated in FIG. 11, each of the blocks BLK0 and BLK1 includes the multiple memory pillars MP and the word lines WLe7 and WLo7. The word line WLe7 includes the conductive layers 21-0, 21-2, 21-4, 21-6, 21-8, 21-10, 21-12, and 21-14. The word line WLo7 includes the conductive layers 21-1, 21-3, 21-5, 21-7, 21-9, 21-11, 21-13, and 21-15. The conductive layers 21-0 to 21-15 each extends in the X direction and are alternately arranged in the Y direction. Hereinafter, a conductive layer 21 refers to each of the conductive layers 21-0 to 21-15.

The sixteen conductive layers 21-0 to 21-15 that extend in the X direction are alternately arranged along the Y direction. The conductive layers 21-0, 21-2, 21-4, 21-6, 21-8, 21-10, 21-12, and 21-14 are electrically connected to each other at one end in the X direction, and function as the word lines WLe7. The conductive layers 21-1, 21-3, 21-5, 21-7, 21-9, 21-11, 21-13, and 21-15 are electrically connected to each other at the other end in the X direction, and function as the word lines WLo7. Each of the word lines WLe 7 and WLo 7 is connected to an upper layer wire (not illustrated) via a contact plug in the hookup areas, and further connected to the row decoder 11.

The word lines WLe6 to WLe0 are provided in an order below the word line WLe7, and the word lines WLo6 to WLo0 are provided in an order below the word line WLo7. The configuration of each of the word lines WLe6 to WLe0 is similar to that of the word line WLe7, and the configuration of each of the word lines WLo6 to WLo0 is similar to that of WLo7.

In the block BLK0 (or BLK1), the conductive layers 21 adjacent to each other in the Y direction are spaced from each other by a memory trench MST.

In addition, multiple memory pillars MP are arranged at predetermined intervals in the X direction on the memory trench MST between the conductive layers 21 adjacent to each other in the Y direction. Specifically, the multiple memory pillars MP are provided between the conductive layers 21-0 and 21-1, between the conductive layers 21-1 and 21-2, between the conductive layers 21-2 and 21-3, . . . , and between the conductive layers 21-14 and 21-15.

Hereinbelow, the configuration of the boundary of the blocks BLK0 and BLK1 will be described.

As illustrated in FIG. 11, in the boundary of the blocks BLK0 and BLK1, the conductive layer 21-15 of the block BLK0 and the conductive layer 21-0 of the block BLK1 are disposed. A memory trench MST is disposed between the conductive layers 21-15 and 21-0. In addition, multiple memory pillars MPa are arranged at predetermined intervals in the X direction on the memory trench MST between the conductive layers 21-15 and 21-0.

The portions where the conductive layer 21-15 (i.e., the word line WLo7) intersects with the memory pillars MPa operate as the memory cell transistors in the block BLK0. In addition, the portions where the conductive layer 21-0 (i.e., the word line WLe7) intersects with the memory pillars MPa operate as the memory cell transistors in the block BLK0.

1.3 Effects of First Embodiment

According to the first embodiment, it is possible to provide a semiconductor memory device capable of improving the operation reliability. Further, since no unusable memory cells or word lines exist in the boundary of the blocks BLK0 and BLK1, an effective use rate of the memory cells is not deteriorated.

As described above, in the first embodiment, the select gate line SGD7 of the block BLK0 and the select gate line SGD0 of the block BLK1 are disposed in the boundary of the blocks BLK0 and BLK1, and the word line WLo7 of the block BLK0 and the word line WLe7 of the block BLK1 are disposed below the select gate lines SGD7 and SGD0. In addition, the memory pillars MPa are arranged in the X direction between the select gate lines SGD7 and SGD0 and between the word lines WLo7 and WLe7. The portions where the word line WLo7 intersects with the memory pillar MPa function as the memory cell transistors in the string unit SU7 of the block BLK0. The portions where the word line WLe7 intersects with the memory pillars MPa function as the memory cell transistors in the string unit SU0 of the block BLK1.

According to the first embodiment having the above-described configuration, since no unusable or dummy memory cells or word lines are disposed in the boundary of the blocks BLK, the arrangement of the memory cells may be highly densified.

2. Second Embodiment

Next, a semiconductor memory device of a second embodiment will be described. In the second embodiment, a word line is disposed in the boundary of the blocks BLK to serve as a word line which is not used at the time of write, read, and erase operations on the blocks BLK, and memory cells connected to the word line are set as dummy memory cells. The second embodiment will be described focusing on differences from the first embodiment. The other configurations which are not described are similar to those in the first embodiment.

2.1 Configuration of Block Boundary in Memory Array Area and Hookup Areas

Similarly to the first embodiment, the configuration of the boundary of the blocks BLK will be described using the boundary of the blocks BLK0 and BLK1 as an example. The configuration of the boundary between the other blocks BLK is similar to that of the boundary between the blocks BLK0 and BLK1.

Figure 12:
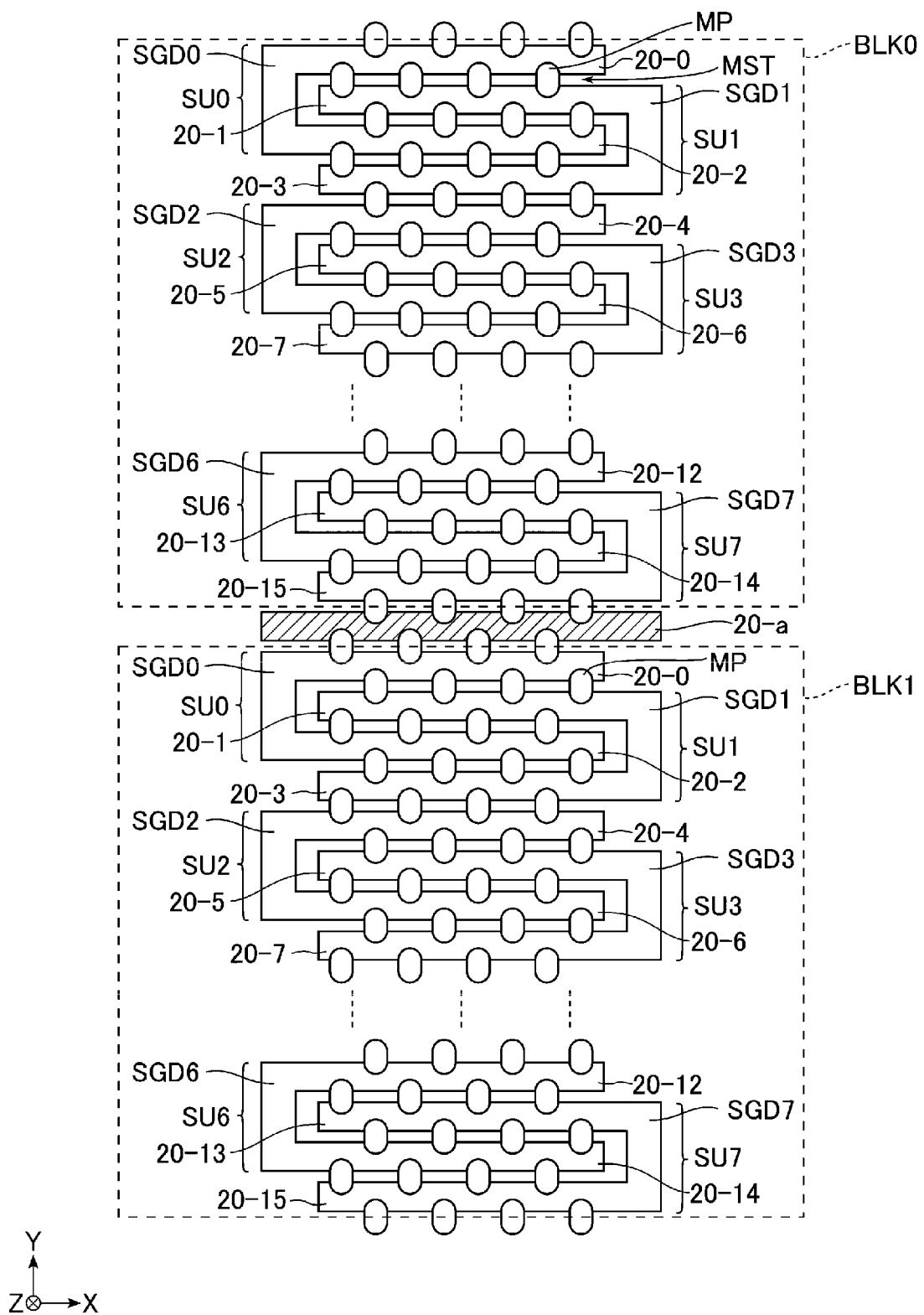
FIG. 12 is a planar layout of memory pillars arranged in a block and select gate lines connected to the memory pillars according to a second embodiment.

First, the configuration of the select gate lines SGD in the blocks BLK0 and BLK1 will be described. FIG. 12 is a planar layout of the memory pillars MP arranged in the blocks BLK0 and BLK1 and the select gate lines SGD0 to SGD7 connected to the memory pillars MP.

The configuration of each of the blocks BLK0 and BLK1 is similar to that in the first embodiment. The sixteen conductive layers 20-0 to 20-15 that extend in the X direction are arranged along the Y direction. The conductive layers 20-0 and 20-2, 20-4 and 20-6, 20-8 and 20-10, and 20-12 and 20-14 are electrically connected to each other at one end in the X direction, and function as the select gate line SGD0, SGD2, SGD4, and SGD6, respectively. The conductive layers 20-1 and 20-3, 20-5 and 20-7, 20-9 and 20-11, and 20-13 and 20-15 are electrically connected to each other at the other end in the X direction, and function as the select gate line SGD1, SGD3, SGD5, and SGD7, respectively.

In the block BLK0 (or BLK1), the conductive layers 20 arranged adjacent to each other in the Y direction are spaced from each other by memory trenches MST. In addition, multiple memory pillars MP are arranged in a staggered manner in the X direction and the Y direction on the multiple memory trenches MST among the conductive layers 20 arranged adjacent to each other in the Y direction.

Hereinbelow, the configuration of the boundary of the blocks BLK0 and BLK1 will be described.

As illustrated in FIG. 12, the blocks BLK0 and BLK1 are arranged adjacent to each other in the Y direction. In the boundary of the blocks BLK0 and BLK1, the conductive layer 20-15 of the block BLK0 and the conductive layer 20-0 of the block BLK1 are disposed. A dummy conductive layer 20-a is provided between the conductive layers 20-15 and 20-0. The dummy conductive layer 20-a is electrically connected to contact plugs and an upper layer wire (not illustrated) in the hookup areas. In addition, multiple memory pillars MP are disposed between the conductive layer 20-15 and the dummy conductive layer 20-a, and between the conductive layer 20-0 and the dummy conductive layer 20-a. In other words, the dummy conductive layer 20-a is disposed between the memory pillars MP in the block BLK0 and the memory pillars MP in the block BLK1, in the boundary of the blocks BLK0 and BLK1. The dummy conductive layer 20-a is connected to an upper layer wire via contact plugs in the hookup areas. At the time of write, read, and erase operations, the same voltage as that applied to a select gate line of an unselected block BLK (e.g., 0 V) is applied to the dummy conductive layer 20-a.

The portions where the memory pillars MP disposed between the conductive layer 20-15 and the dummy conductive layer 20-a intersect with the conductive layer 20-15 (i.e., the select gate line SGD7) operate as the select transistors in the block BLK0. Meanwhile, the portions where the memory pillars MP disposed between the conductive layer 20-15 and the dummy conductive layer 20-a intersect with the dummy conductive layer 20-a are select transistors which are not used. A dummy memory cell refers to a memory cell which is not used for a write, read or erase operation, and to which a voltage for a write, read or erase is not applied at the time of a write, read or erase operation.

Similarly, the portions where the memory pillars MP disposed between the conductive layer 20-0 and the dummy conductive layer 20-a intersect with the conductive layer 20-0 (i.e., the select gate line SGD0) operate as the select transistors in the block BLK1. Meanwhile, the portions where the memory pillars MP disposed between the conductive layer 20-0 and the dummy conductive layer 20-a intersect with the dummy conductive layer 20-a are select transistors which are not used.

Figure 13:
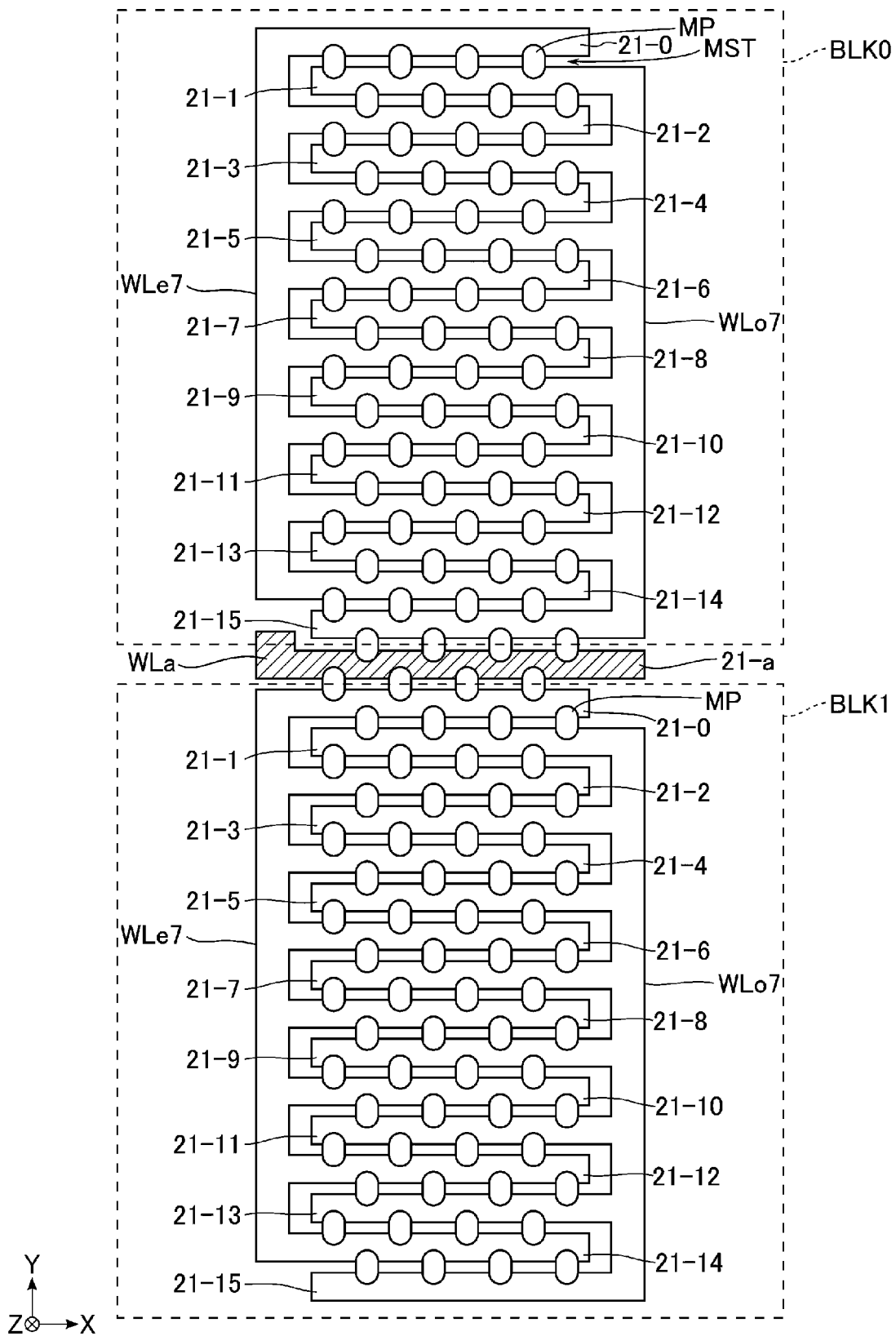
FIG. 13 is a planar layout of memory pillars arranged in a block and word lines connected to the memory pillars according to the second embodiment.

Next, the configuration of the word lines WL in the blocks BLK0 and BLK1 will be described. FIG. 13 is a planar layout of the memory pillars MP arranged in the blocks BLK0 and BLK1 and the word lines WLe7 and WLo7 connected to the memory pillars MP.

The configuration of the memory pillars MP, the word lines WLe7 and WLo7, and the memory trenches MST in each of the blocks BLK0 and BLK1 is similar to that in the first embodiment, and is identically applied to third and subsequent embodiments.

Hereinbelow, the configuration of the boundary of the blocks BLK0 and BLK1 will be described.

As illustrated in FIG. 13, the blocks BLK0 and BLK1 are arranged adjacent to each other in the Y direction. In the boundary of the blocks BLK0 and BLK1, the conductive layer 21-15 of the block BLK0 and the conductive layer 21-0 of the block BLK1 are disposed. The dummy conductive layer 21-a is provided between the conductive layers 21-15 and 21-0. The dummy conductive layer 21-a is electrically connected to contact plugs and an upper layer wire (not illustrated) in the hookup areas.

Memory trenches MST are disposed between the conductive layer 21-15 and the dummy conductive layer 21-a, and between the conductive layer 21-0 and the dummy conductive layer 21-a. Further, multiple memory pillars MP are disposed between the conductive layer 21-15 and the dummy conductive layer 21-a, and between the conductive layer 21-0 and the dummy conductive layer 21-a. In other words, the dummy conductive layer 21-a is disposed between the memory pillars MP in the block BLK0 and the memory pillars MP in the block BLK1, in the boundary of the blocks BLK0 and BLK1. The dummy conductive layer 21-a is electrically connected to an upper layer wire (not illustrated) via contact plugs in the hookup areas, and functions as a word line WLa.

The portions where the memory pillars MP disposed between the conductive layer 21-15 of the block BLK0 and the dummy conductive layer 21-a intersect with the conductive layer 21-15 operate as the memory cell transistors in the block BLK0. Meanwhile, the portions where the memory pillars MP disposed between the conductive layer 21-15 of the block BLK0 and the dummy conductive layer 21-a intersect with the dummy conductive layer 21-a are dummy memory cells which are not used.

The portions where the memory pillars MP disposed between the conductive layer 21-0 of the block BLK1 and the dummy conductive layer 21-a intersect with the conductive layer 21-0 operate as the memory cell transistors in the block BLK1. Meanwhile, the portions where the memory pillars MP disposed between the conductive layer 21-0 of the block BLK1 and the dummy conductive layer 21-a intersect with the dummy conductive layer 21-a are dummy memory cells which are not used. The other configurations are similar to those in the first embodiment.

2.3 Effects of Second Embodiment

According to the second embodiment, it is possible to provide a semiconductor memory device capable of improving the operation reliability.

As described above, the word line WLa (the dummy conductive layer 21-a) is disposed between the word line WLo7 (the conductive layer 21-15) of the block BLK0 and the word line WLe7 (the conductive layer 21-0) of the block BLK1, in the boundary of the blocks BLK0 and BLK1. The portions where the memory pillars MP between the word line WLo7 and the word line WLa intersect with the word line WLo7 operate as the memory cell transistors in the block BLK0.

The portions where the memory pillars MP between the word lines WLe7 and WLa intersect with the word line WLe7 operate as the memory cell transistors in the block BLK1. Meanwhile, the portions where the memory pillars MP between the word lines WLe7 and WLa intersect with the word line WLa are dummy memory cells which are not used. The word line WLa is connected to an upper layer wire via contact plugs, and further connected to the row decoder 11.

The same voltage as that applied to a word line WL of an unselected block BLK (e.g., 0 V) is applied to the word line WLa (the dummy conductive layer 21-$a$) at the time of write, read, and erase operations. For example, when 24 V is applied to the semiconductor layers of the memory cell transistors in the block BLK0 (or BLK1) at the time of an erase operation on the block BLK0 (or BLK1), 0 V is applied to the word line WLa.

As described above, by controlling the potential of the word line WLa, it is possible to eliminate a disturbance that occurs in the memory cell transistors of the memory pillars MPa, which are connected to the word line WLa, in the block BLK1 (or BLK0) at the time of write, read, and erase operations. That is, it is possible to eliminate a disturbance that occurs in the memory cell transistors arranged in the boundary of the blocks BLK, from an adjacent block BLK, at the time of write, read, and erase operations. As a result, according to the second embodiment, it is possible to improve the operation reliability of the semiconductor memory device.

3. Third Embodiment

Next, a semiconductor memory device of a third embodiment will be described. In the third embodiment, two word lines are disposed in the boundary of the blocks BLK to serve as word lines which are not used at the time of write, read, and erase operations on the blocks BLK, and memory cells connected to the word lines are set as dummy memory cells. The third embodiment will be described focusing on differences from the first embodiment. The other configurations which are not described are similar to those in the first embodiment.

3.1 Configuration of Block Boundary in Memory Array Area and Hookup Areas

Similarly to the first embodiment, the configuration of the boundary of the blocks BLK will be described using the boundary of the blocks BLK0 and BLK1 as an example. The configuration of the boundary between the other blocks BLK is the same as the boundary between the blocks BLK0 and BLK1.

Figure 14:
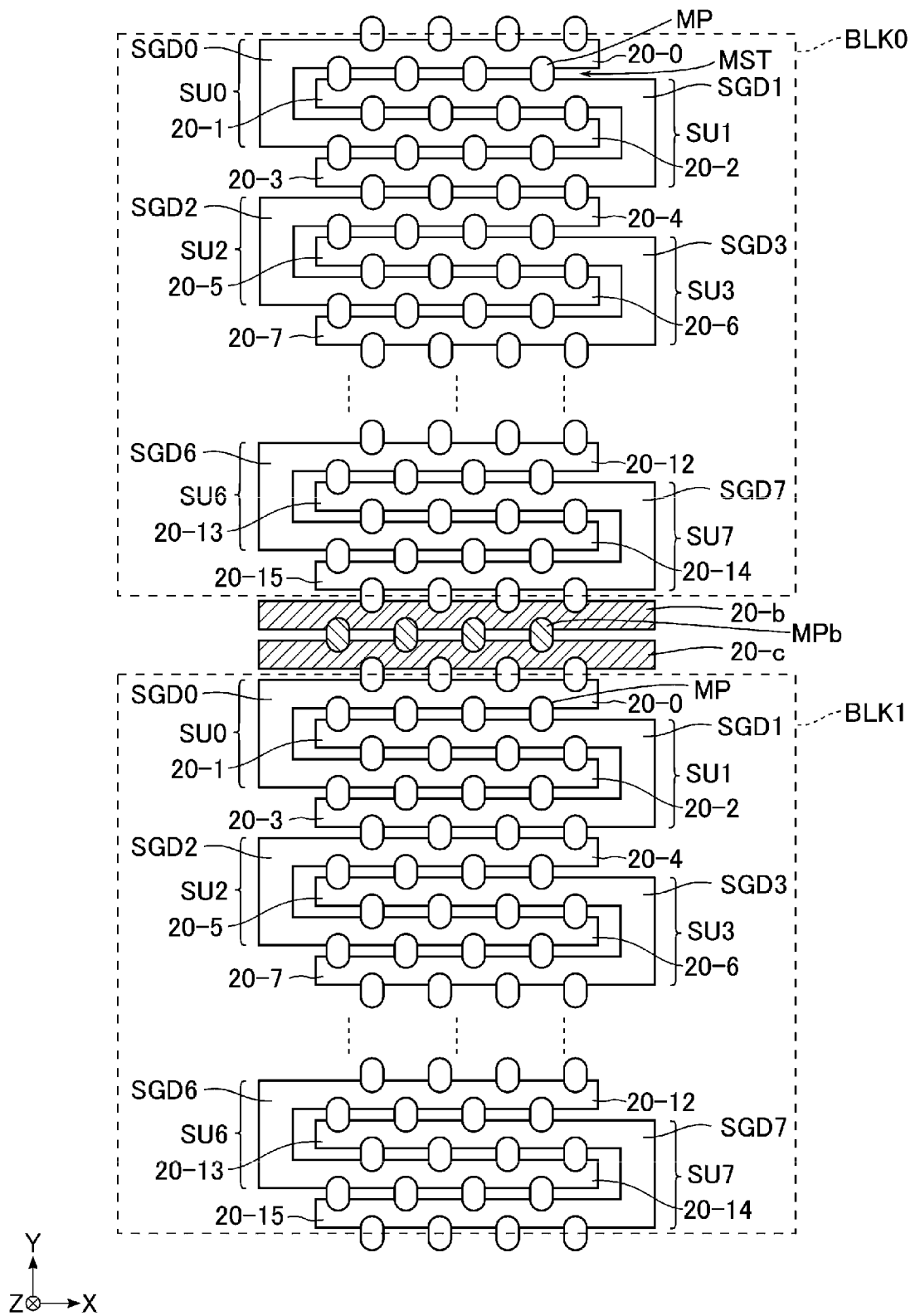
FIG. 14 is a planar layout of memory pillars arranged in a block and select gate lines connected to the memory pillars according to a third embodiment.

First, the configuration of the select gate lines SGD in the blocks BLK0 and BLK1 will be described. FIG. 14 is a planar layout of the memory pillars MP arranged in the blocks BLK0 and BLK1 and the select gate lines SGD0 to SGD7 connected to the memory pillars MP.

The configuration of the memory pillars MP, the conductive layers 20-0 to 20-15, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 14, the blocks BLK0 and BLK1 are arranged adjacent to each other in the Y direction. In the boundary of the blocks BLK0 and BLK1, the conductive layer 20-15 of the block BLK0 and the conductive layer 20-0 of the block BLK1 are disposed. Dummy conductive layers 20-$b$ and 20-$c$ are provided between the blocks BLK0 and BLK1, that is, between the conductive layers 20-15 and 20-0. The respective dummy conductive layers 20-$b$ and 20-$c$ extend in the X direction and are arranged in the Y direction. Each of the dummy conductive layers 20-$b$ and 20-$c$ is electrically connected to an upper layer wire via contact plugs in the hookup areas. At the time of write, read, and erase operations, the same voltage as that applied to a select gate line of an unselected block BLK (e.g., 0 V) is applied to the dummy conductive layers 20-$b$ and 20-$c$.

Memory trenches MST are disposed between the conductive layer 20-15 and the dummy conductive layer 20-$b$, between the dummy conductive layers 20-$b$ and 20-$c$, and the dummy conductive layer 20-$c$ and the conductive layer 20-0. Multiple memory pillars MP are arranged at predetermined intervals in the X direction on the memory trench MST between the conductive layer 20-15 and the dummy conductive layer 20-$b$ and the memory trench MST between the dummy conductive layers 20-$c$ and the conductive layer 20-0. In addition, multiple dummy memory pillars MPb are arranged at predetermined intervals in the X direction on the memory trench MST between the dummy conductive layers 20-$b$ and 20$c$. The dummy memory pillars MPb include memory cell transistors and select transistors which are not used for write, read, and erase operations. Each of the memory pillars MP is electrically connected to a bit line BL that is disposed above the memory pillars MP and extends in the Y direction. However, each of the dummy memory pillars MPb is not electrically connected to a bit line BL that is disposed above the dummy memory pillar MPb and extends the Y direction.

The portions where the memory pillars MP disposed between the conductive layer 20-15 of the block BLK0 and the dummy conductive layer 20-$b$ intersect with the conductive layer 20-15 operate as the select transistors in the block BLK0. Meanwhile, the portions where the memory pillars MP disposed between the conductive layer 20-15 of the block BLK0 and the dummy conductive layer 20-$b$ intersect with the dummy conductive layer 20-$b$ are dummy select transistors which are not used.

The portions where the memory pillars MP disposed between the conductive layer 20-0 of the block BLK1 and the dummy conductive layer 20-$c$ intersect with the conductive layer 20-0 operate as the select transistors in the block BLK1. Meanwhile, the portions where the memory pillars MP disposed between the conductive layer 20-0 and the dummy conductive layer 20-$c$ intersect with the dummy conductive layer 20-$c$ are dummy select transistors which are not used.

In addition, the portions where the dummy memory pillars MPb disposed between the dummy conductive layers 20-$b$ and 20-$c$ intersect with the dummy conductive layers 20-$b$ and 20-$c$ are dummy select transistors which are not used.

Figure 15:
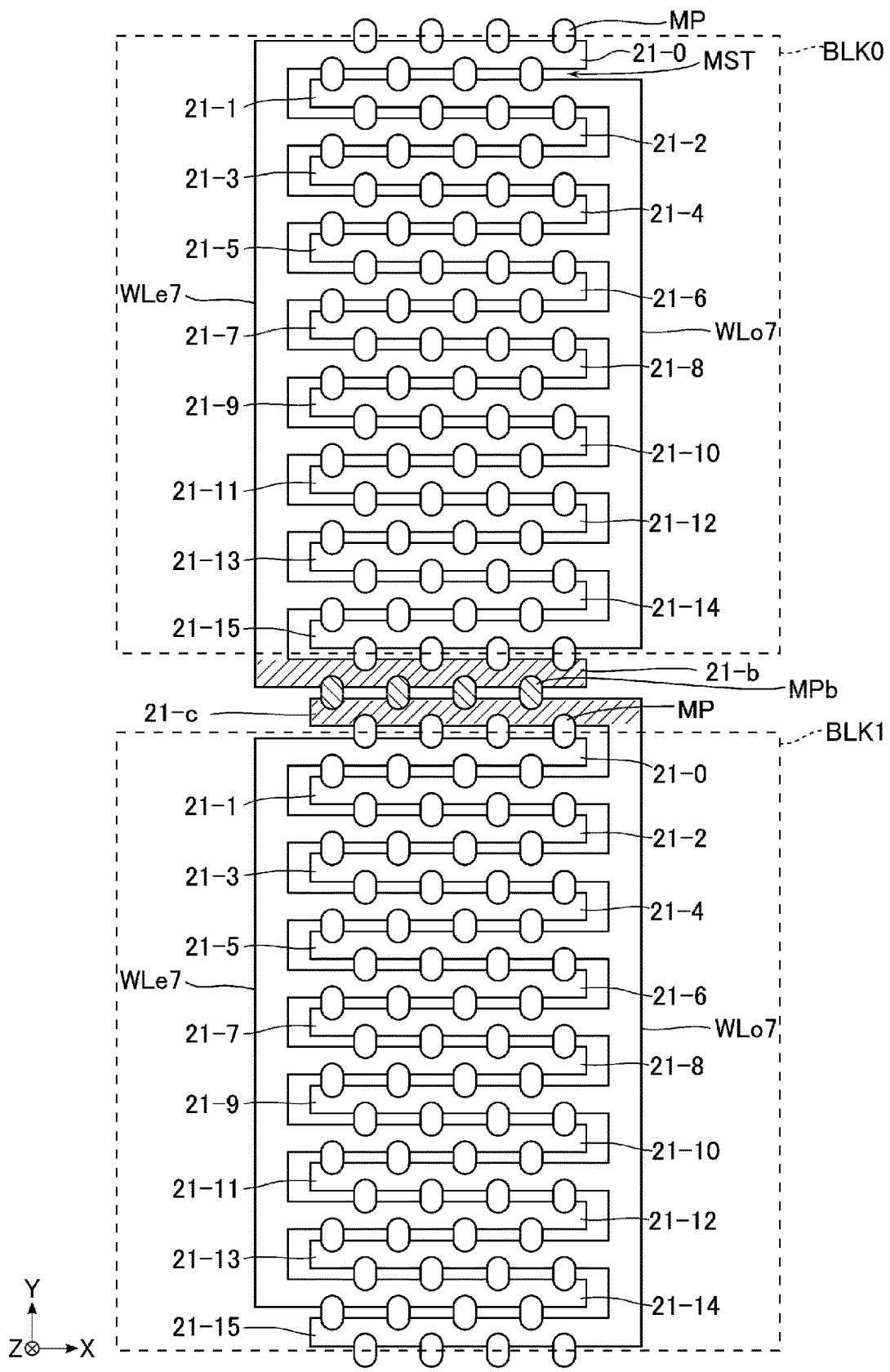
FIG. 15 is a planar layout of memory pillars arranged in a block and word lines connected to the memory pillars according to the third embodiment.

Next, the configuration of the word lines WL in the blocks BLK0 and BLK1 will be described. FIG. 15 is a planar layout of the memory pillars MP arranged in the blocks BLK0 and BLK1 and the word lines WLe7 and WLo7 connected to the memory pillars MP.

The configuration of the memory pillars MP, the word lines WLe7 and WLo7 in the portions excluding the boundary of the blocks BLK, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 15, the blocks BLK0 and BLK1 are arranged adjacent to each other in the Y direction. In the boundary of the blocks BLK0 and BLK1, the conductive layer 21-15 of the block BLK0 and the conductive layer 21-0 of the block BLK1 are disposed. The dummy conductive layers 21-*b* and 21-*c* are arranged in the Y direction between the conductive layers 21-15 and 21-0.

The dummy conductive layer 21-*b* extends in the X direction, and is electrically connected to the conductive layer 21-14 (the word line WLe7) of the block BLK0 at one end in the X direction. The dummy conductive layer 21-*c* extends in the X direction, and is electrically connected to the conductive layer 21-1 (the word line WLo7) of the block BLK1 at the other end in the X direction.

The memory trenches MST are disposed between the conductive layer 21-15 and the dummy conductive layer 21-*b*, between the dummy conductive layers 21-*b* and 21-*c*, and between the dummy conductive layers 21-*c* and the conductive layer 21-0. The multiple memory pillars MP are arranged at predetermined intervals in the X direction on the memory trench MST between the conductive layer 21-15 and the dummy conductive layer 21-*b* and the memory trench MST between the conductive layers 21-0 and the dummy conductive layer 21-*c*. In addition, the multiple dummy memory pillars MPb are arranged at predetermined intervals in the X direction on the memory trench MST between the dummy conductive layers 21-*b* and 21-*c*.

The portions where the memory pillars MP disposed between the conductive layer 21-15 of the block BLK0 and the dummy conductive layer 21-*b* intersect with the conductive layer 21-15 operate as the memory cell transistors in the block BLK0. Meanwhile, the portions where the memory pillars MP disposed between the conductive layer 21-15 of the block BLK0 and the dummy conductive layer 21-*b* intersect with the dummy conductive layer 21-*b* are dummy memory cells which are not used.

The portions where the memory pillars MP disposed between the conductive layer 21-0 of the block BLK1 and the dummy conductive layer 21-*c* intersect with the conductive layer 21-0 operate as the memory cell transistors in the block BLK1. Meanwhile, the portions where the memory pillars MP disposed between the conductive layer 21-0 and the dummy conductive layer 21-*c* intersect with the dummy conductive layer 21-*c* are dummy memory cells which are not used.

In addition, the portions where the dummy memory pillars MPb disposed between the dummy conductive layers 21-*b* and 21-*c* intersect with the dummy conductive layers 21-*b* and 21-*c* are dummy memory cells which are not used. The other configurations are similar to those in the first embodiment.

3.3 Effects of Third Embodiment

According to the third embodiment, it is possible to provide a semiconductor memory device capable of improving the operation reliability.

As described above, the dummy conductive layers 21-*b* and 21-*c* are disposed between the word line WLo7 (the conductive layer 21-15) of the block BLK0 and the word line WLe7 (the conductive layer 21-0) of the block BLK1, in the boundary of the blocks BLK0 and BLK1. The dummy conductive layer 21-*b* is connected to the word line WLe7 of the block BLK0, and the dummy conductive layer 21-*c* is connected to the word line WLo7 of the block BLK1.

The portions where the memory pillars MP between the word line WLo7 and the dummy conductive layer 21-*b* intersect with the word line WLo7 operate as the memory cell transistors in the block BLK0. The portions where the memory pillars MP between the word line WLe7 and the dummy conductive layer 21-*c* intersect with the word line WLe7 operate as the memory cell transistors in the block BLK1. Meanwhile, the memory cell transistors of the dummy memory pillars MPb connected to the dummy conductive layers 21-*b* and 21-*c* are dummy memory cells which are not used.

At the time of write, read, and erase operations on the block BLK0 (or BLK1), a voltage to be applied to a word line of an operation target is applied to the memory pillars MPb between the dummy conductive layers 21-*b* and 21-*c*. Thus, a disturbance occurs in the memory cell transistors of the memory pillars MPb connected to the dummy conductive layer 21-*b* (or 21-*c*) at the time of write, read, and erase operations. However, since the memory cell transistors of the dummy memory pillars MPb are dummy memory cells which are not used, there is no problem even though the disturbance occurs at the time of write, read, and erase operations.

As described above, in the third embodiment, it is possible to eliminate the disturbance that occurs in the memory cell transistors disposed at the boundary of the blocks BLK, from a word line WL of an adjacent block BLK, at the time of write, read, and erase operations. As a result, according to the third embodiment, it is possible to improve the operation reliability of the semiconductor memory device.

In addition, in the third embodiment, since the two dummy word lines may share the word lines of the nearby blocks BLK, respectively, the size of the chip on which the semiconductor memory device 1 is to be mounted may be reduced, as compared to the second embodiment.

4. Fourth Embodiment

Next, a semiconductor memory device of a fourth embodiment will be described. In the fourth embodiment, memory pillars disposed at the boundary of the blocks BLK are set as dummy memory pillars. That is, memory cell transistors provided in the boundary of the blocks BLK are set as dummy memory cells. The fourth embodiment will be described focusing on differences from the first embodiment. The other configurations which are not described are similar to those in the first embodiment.

4.1 Configuration of Block Boundary in Memory Array Area and Hookup Areas

The configuration of the boundary of the blocks BLK will be described using the boundary of the blocks BLK0 and BLK1 and the boundary of the blocks BLK1 and BLK2, as an example. The configuration of the boundary between the other blocks BLK is a repetition of the boundary between the blocks BLK0 and BLK1 and the boundary between the blocks BLK1 and BLK2.

Figure 16:
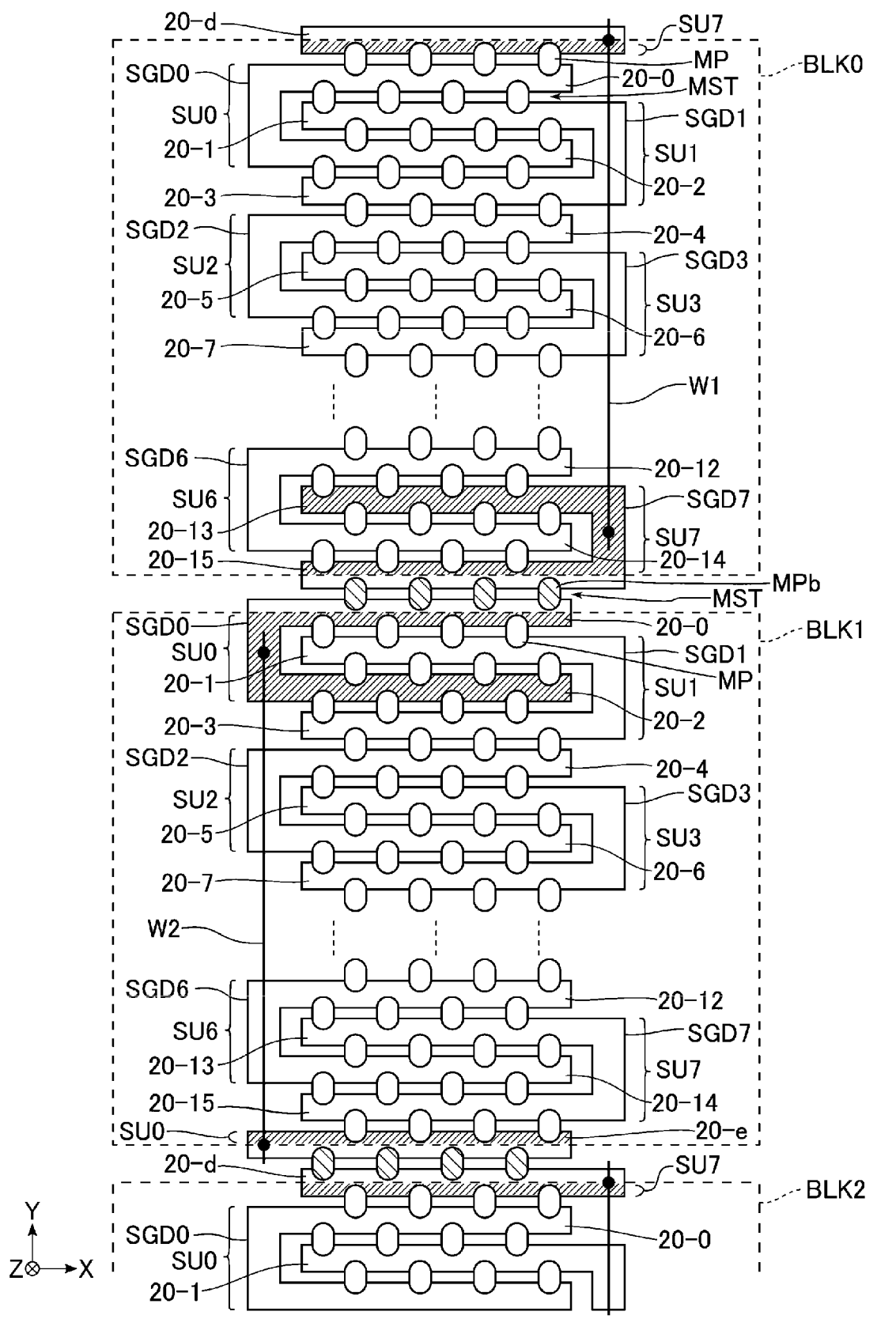
FIG. 16 is a planar layout of memory pillars arranged in a block and select gate lines connected to the memory pillars according to a fourth embodiment.

First, the configuration of the select gate lines SGD in the blocks BLK0 and BLK1 will be described. FIG. 16 is a planar layout of the memory pillars MP arranged in the blocks BLK0 and BLK1 and the select gate lines SGD0 to SGD7 connected to the memory pillars MP.

The configuration of the memory pillars MP, the conductive layers 20-0 to 20-15, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 16, the blocks BLK0, BLK1, and BLK2 are arranged in an order to be adjacent to each other in the Y direction. In the boundary of the blocks BLK0 and BLK1, the conductive layer 20-15 of the block BLK0 and the conductive layer 20-0 of the block BLK1 are disposed.

A memory trench MST is disposed between the conductive layers 20-15 and 20-0. Multiple dummy memory pillars MPb are arranged at predetermined intervals in the X direction on the memory trench MST between the conductive layers 20-15 and 20-0.

Here, the portions where the conductive layer 20-15 of the block BLK0 intersect with the dummy memory pillars MPb are dummy select transistors. Thus, the number of select transistors connected to the select gate line SGD7 is reduced by the number of a series of transistors in the X direction (here, four transistors), as compared to the number of select transistors connected to each of the other select gate lines SGD. In other words, the number of select transistors in the string unit SU7 is reduced by the number of a series of transistors in the X direction, as compared to the number of select transistors in each of the other string units SU.

Accordingly, in order to supplement the select transistors, a conductive layer 20-*d* is provided in the Y direction of the conductive layer 20-0 of the block BLK0, and memory pillars MP are disposed between the conductive layers 20-0 and 20-*d*. A series of select transistors in the X direction are provided at the portions where the conductive layer 20-*d* intersects with the memory pillars MP. In addition, the select gate line SGD7 and the conductive layer 20-*d* are electrically connected to each other by an upper layer wire W1 via, for example, contact plugs. Thus, the select transistors provided at the portions where the conductive layer 20-*d* intersects with the memory pillars MP are used as the select transistors in the select gate line SGD7.

Hereinbelow, the configuration of the boundary of the blocks BLK1 and BLK2 will be described.

As illustrated in FIG. 16, the blocks BLK1 and BLK2 are arranged adjacent to each other in the Y direction. In the boundary of the blocks BLK1 and BLK2, the conductive layer 20-15 of the block BLK1 and the conductive layer 20-0 of the block BLK2 are disposed. Conductive layers 20-*e* and 20-*d* that extend in the X direction are provided between the conductive layers 20-15 and 20-0.

Memory trenches MST are disposed between the conductive layers 20-15 and 20-*e*, between the conductive layers 20-0 and 20-*d*, and between the conductive layers 20-*e* and 20-*d*. Multiple memory pillars MP are arranged at predetermined intervals in the X direction on the memory trench MST between the conductive layers 20-15 and 20-*e*, the memory trench MST between the conductive layers 20-0 and 20-*d*, and the memory trench MST between the conductive layers 20-*e* and 20-*d*.

Here, as described above, the portions where the conductive layer 20-0 of the block BLK1 intersects with the dummy memory pillars MPb are dummy select transistors. Thus, the number of select transistors in the select gate line SGD0 of the block BLK1 is reduced by the number of a series of transistors in the X direction (here, four transistors), as compared to the number of select transistors in each of the other select gate lines SGD.

Accordingly, in order to supplement the select transistors, the conductive layer 20-*e* is provided in the Y direction of the conductive layer 20-15 of the block BLK1, and memory pillars MP are disposed between the conductive layers 20-15 and 20-*e*. A series of select transistors in the X direction are provided at the portions where the conductive layer 20-*e* intersects with the memory pillars MP. In addition, the select gate line SGD0 and the conductive layer 20-*e* are electrically connected to each other by an upper layer wire W2 via, for example, contact plugs. Thus, the select transistors provided at the portions where the conductive layer 20-*e* intersects with the memory pillars MP are used as the select transistors in the select gate line SGD0.

In addition, each of the memory pillars MP is electrically connected to a bit line BL that is disposed above the memory pillars MP and extends in the Y direction. However, each of the dummy memory pillars MPb is not electrically connected to a bit line BL that is disposed above the dummy memory pillars MPb and extends the Y direction.

Figure 17:
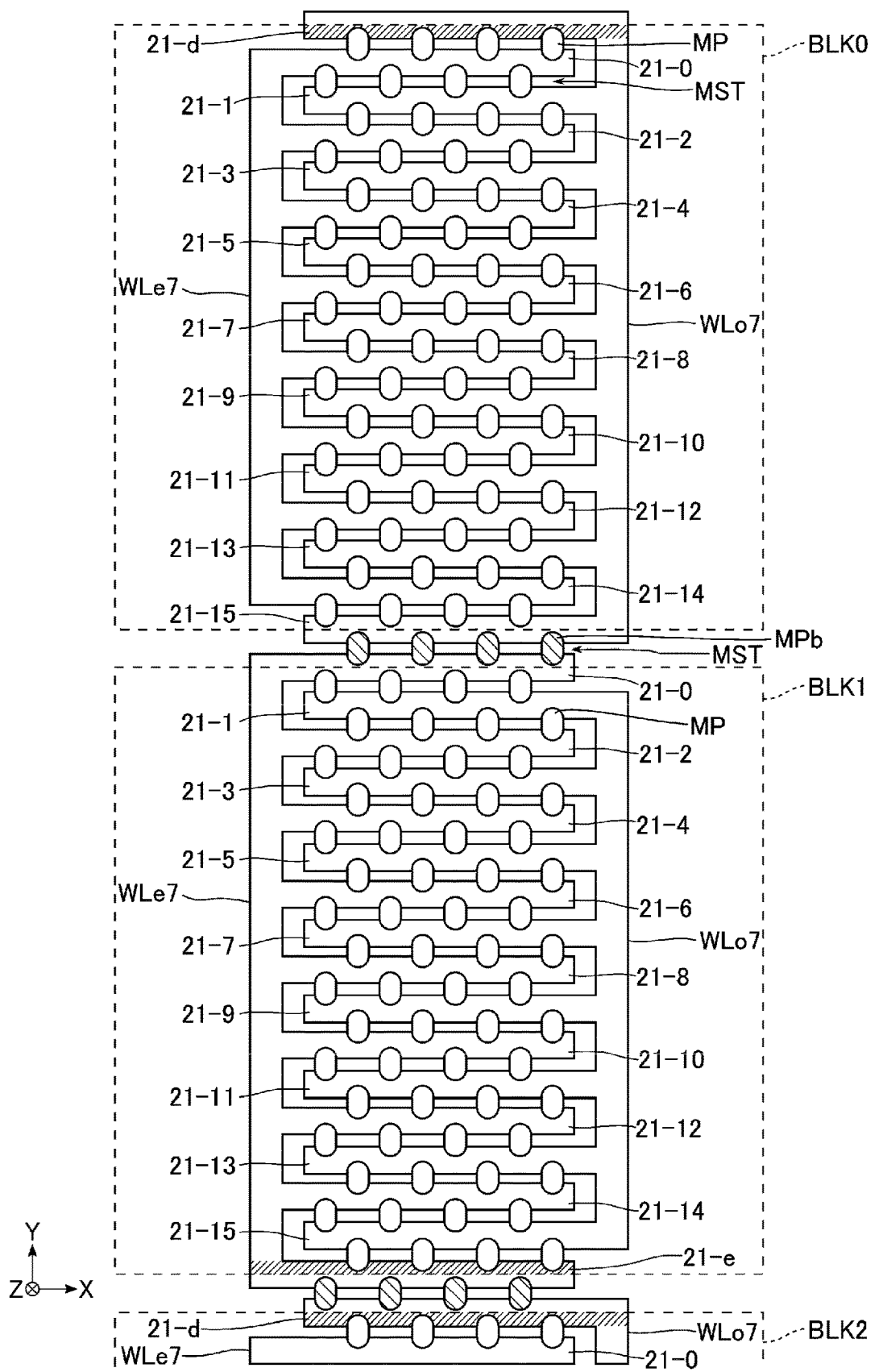
FIG. 17 is a planar layout of memory pillars arranged in a block and word lines connected to the memory pillars according to the fourth embodiment.

Next, the configuration of the word lines WL in the blocks BLK0 and BLK1 will be described. FIG. 17 is a planar layout of the memory pillars MP arranged in the blocks BLK0 and BLK1 and the word lines WLe7 and WLo7 connected to the memory pillars MP.

The configuration of the memory pillars MP, the word lines WLe7 and WLo7 in the portions excluding the boundary of the blocks BLK, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 17, the blocks BLK0, BLK1, and BLK2 are arranged in an order to be adjacent to each other in the Y direction. In the boundary of the blocks BLK0 and BLK1, the conductive layer 21-15 of the block BLK0 and the conductive layer 21-0 of the block BLK1 are disposed.

A memory trench MST is disposed between the conductive layers 21-15 and 21-0. Multiple dummy memory pillars MPb are arranged at predetermined intervals in the X direction on the memory trench MST between the conductive layers 21-15 and 21-0.

Here, the portions where the conductive layer 21-15 of the block BLK1 intersects with the dummy memory pillars MPb are dummy memory cell transistors. Thus, the number of operable memory cell transistors in the word line WLo7 of the block BLK0 is reduced by the number of memory cell transistors in a series of memory pillars in the X direction. That is, the number of operable memory cell transistors in the string unit SU7 is smaller than the number of operable memory cell transistors in each of the other string units SU.

Accordingly, in order to supplement the memory cell transistors, a conductive layer 21-*d* that extends in the X direction is provided in the Y direction of the conductive layer 21-0 of the block BLK0. The conductive layer 21-*d* is electrically connected to the conductive layers 21-1, 21-3, 21-5, . . . , and 21-15 at the other end in the X direction, and functions as the word line WLo7. Memory pillars MP are disposed between the conductive layers 21-0 and 21-*d*.

A series of memory cell transistors in the X direction are provided at the portions where the conductive layer 21-*d* intersects with the memory pillars MP. The memory cell transistors are used as the operable memory cell transistors in the string unit SU7.

Hereinbelow, the configuration of the boundary of the blocks BLK1 and BLK2 will be described.

As illustrated in FIG. 17, the blocks BLK1 and BLK2 are arranged adjacent to each other in the Y direction. In the boundary of the blocks BLK1 and BLK2, the conductive layer 21-15 of the block BLK1 and the conductive layer 21-0 of the block BLK2 are disposed. Conductive layers 21-*e* and 21-*d* that extend in the X direction are provided between the conductive layers 21-15 and 21-0.

Memory trenches MST are disposed between the conductive layers 21-15 and 21-*e*, between the conductive layers 21-0 and 21-*d*, and between the conductive layers 21-*e* and 21-*d*. Multiple memory pillars MP are arranged at predetermined intervals in the X direction on the memory trench MST between the conductive layers 21-15 and 21-e, the memory trench MST between the conductive layers 21-0 and 21-d, and the memory trench MST between the conductive layers 21-e and 21-d.

Here, the portions where the conductive layer 21-0 of the block BLK1 intersects with the dummy memory pillars MPb are dummy memory cell transistors. Thus, the number of operable memory cell transistors in the word line WLe7 of the block BLK1 is reduced by the number of memory cell transistors in a series of memory pillars in the X direction. That is, the number of operable memory cell transistors in the string unit SU0 is smaller than the number of operable memory cell transistors in each of the other string units SU.

Accordingly, in order to supplement the memory cell transistors, a conductive layer 21-e that extends in the X direction is provided in the Y direction of the conductive layer 21-15 of the block BLK1. The conductive layer 21-e is electrically connected to the conductive layers 21-0, 21-2, 21-4, . . . , and 21-14 atone end in the X direction, and functions as the word line WLe7. Memory pillars MP are disposed between the conductive layers 21-15 and 21-e.

A series of memory cell transistors in the X direction are provided at the portions where the conductive layer 21-e intersects with the memory pillars MP. The memory cell transistors are used as the operable memory cell transistors in the string unit SU0. The other configurations are the same as those in the first embodiment.

In addition, a conductive layer 21-d is provided between the conductive layer 21-0 of the block BLK2 and the conductive layer 21-e. Memory pillars MP are disposed between the conductive layers 21-0 and 21-d. A series of memory cell transistors in the X direction are provided at the portions where the conductive layer 21-d intersects with the memory pillars MP. The memory cell transistors are used to supplement the shortage of the memory cell transistors provided in the conductive layer 21-15 (the string unit SU7) of the block BLK2.

4.2 Effects of Fourth Embodiment

According to the fourth embodiment, it is possible to provide a semiconductor memory device capable of improving the operation reliability.

As described above, the dummy memory pillars MPb are disposed between the conductive layer 21-15 of the block BLK0 and the conductive layer 21-0 of the block BLK1, in the boundary between the blocks BLK0 and BLK1. The dummy memory pillars MPb are not connected to an upper layer wire (bit line) by contact plugs or the like.

The portions where the memory pillars MP between the conductive layers 21-15 and 21-14 of the block BLK0 intersect with the conductive layer 21-15 are operable memory cell transistors, that is, memory cell transistors which are used for write, read, and erase operations. Meanwhile, the portions where the conductive layer 21-15 intersects with the dummy memory pillars MPb are dummy memory cells which are not used for write, read, and erase operations.

The portions where the memory pillars MP between the conductive layers 21-0 and 21-1 of the block BLK1 intersect with the conductive layer 21-0 are memory cell transistors used for write, read, and erase operations. Meanwhile, the portions where the conductive layer 21-0 intersects with the dummy memory pillars MPb are dummy memory cells which are not used for write, read, and erase operations.

In the configuration described above, for example, when a write operation is performed on the string unit SU7 of the block BLK0, a write voltage by the write operation is applied to the conductive layer 21-15. In this case, the write voltage is also applied to the dummy memory pillars MPb arranged in the block boundary and connected to the conductive layer 21-15. However, the dummy memory pillars MPb arranged in the block boundary include the dummy memory cells which are not used. Since the dummy memory cells are disposed at the location where a disturbance occurs at the time of write, read, and erase operations, there is no problem even though the disturbance occurs.

Similarly, when a write operation is performed on the string unit SU0 of the block BLK1, a write voltage is applied to the conductive layer 21-0. In this case, the write voltage is also applied to the dummy memory pillars MPb disposed in the block boundary and connected to the conductive layer 21-0. However, the dummy memory pillars MPb arranged in the block boundary include the dummy memory cells which are not used. Thus, there is no problem even though a disturbance occurs in the dummy memory cells at the time of the write operation.

As described above, in the fourth embodiment, it is possible to eliminate the disturbance that occurs in the memory cell transistors arranged in the boundary of the blocks BLK, from a word line WL of an adjacent block BLK, at the time of write, read, and erase operations. As a result, according to the fourth embodiment, it is possible to improve the operation reliability of the semiconductor memory device.

Further, in the fourth embodiment, since no dummy word lines are disposed in the boundary of the blocks BLK as in the second and third embodiments, the arrangement of the memory cells may be highly densified.

5. Fifth Embodiment

Next, a semiconductor memory device of a fifth embodiment will be described. In the fourth embodiment described above, the dummy memory pillars MPb are disposed at the boundary of the blocks BLK. However, in the fifth embodiment, the dummy memory pillars MPb are not arranged, and only memory trenches MST are disposed at the boundary of the blocks BLK.

5.1 Configuration of Block Boundary in Memory Array Area and Hookup Areas

Similarly to the fourth embodiment, the configuration of the boundary of the blocks BLK will be described using the boundary of the blocks BLK0 and BLK1 and the boundary of the blocks BLK1 and BLK2 as an example. The configuration of the boundary between the other blocks BLK is a repetition of the boundary between the blocks BLK0 and BLK1 and the boundary between the blocks BLK1 and BLK2.

Figure 18:
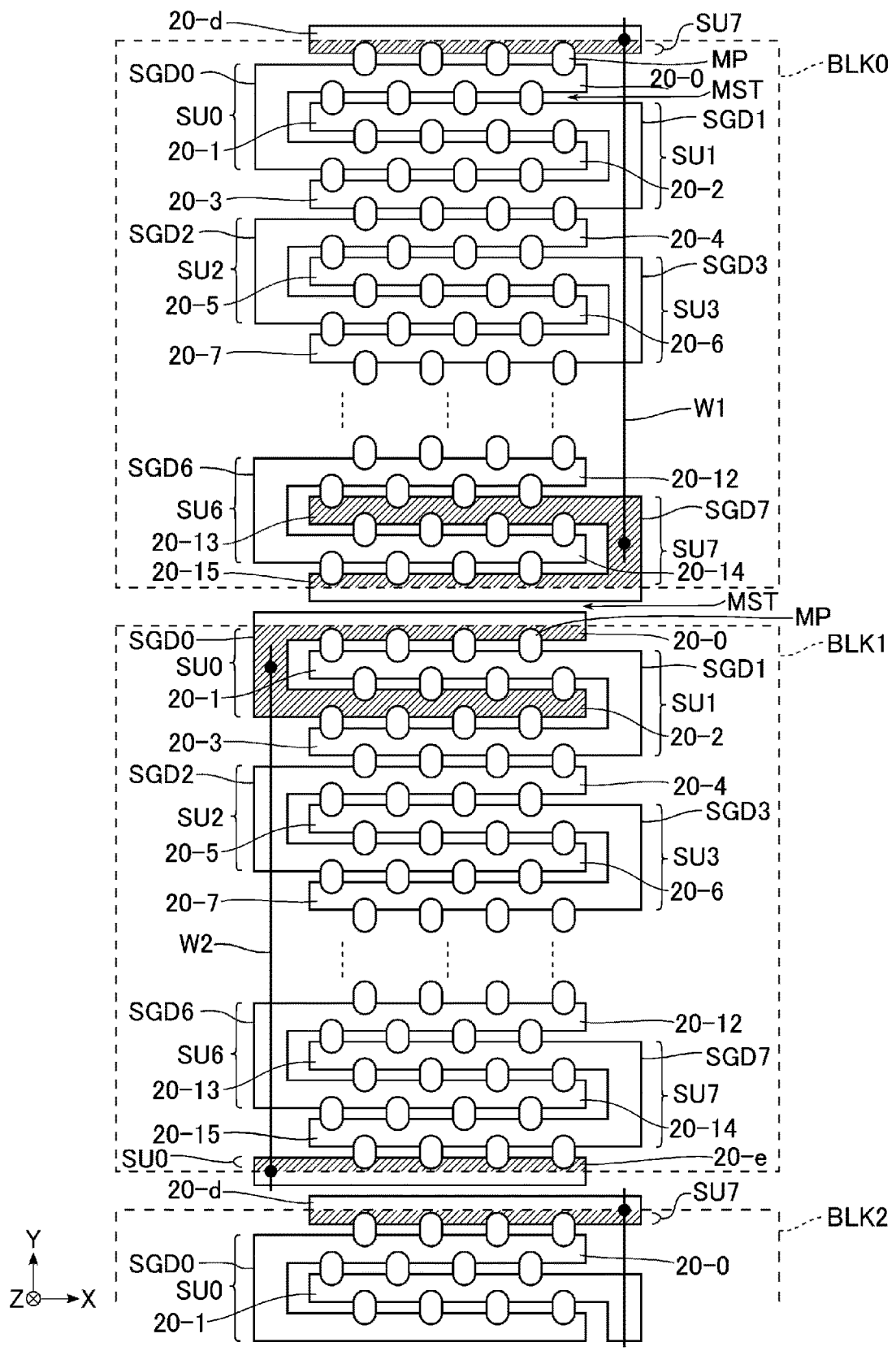
FIG. 18 is a planar layout of memory pillars arranged in a block and select gate lines connected to the memory pillars according to a fifth embodiment.

First, the configuration of the select gate lines SGD in the blocks BLK0 and BLK1 will be described. FIG. 18 is a planar layout of the memory pillars MP arranged in the blocks BLK0 and BLK1 and the select gate lines SGD0 to SGD7 connected to the memory pillars MP.

The configuration of the memory pillars MP, the conductive layers 20-0 to 20-15, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 18, the blocks BLK0, BLK1, and BLK2 are arranged adjacent to each other in the Y direction.

In the boundary of the blocks BLK0 and BLK1, the conductive layer 20-15 of the block BLK0 and the conductive layer 20-0 of the block BLK1 are disposed.

A memory trench MST is disposed between the conductive layers 20-15 and 20-0. In the fourth embodiment described above, the multiple dummy memory pillars MPb are disposed on the memory trench MST between the conductive layers 20-15 and 20-0. However, in the fifth embodiment, no dummy memory pillars or memory pillars are arranged.

Here, since no memory pillars MP are disposed between the conductive layer 20-15 of the block BLK0 and the conductive layer 20-0 of the block BLK1, the number of select transistors in the string unit SU7 is reduced by the number of a series of transistors in the X direction, as compared to the number of select transistors in each of the other string units SU.

Accordingly, in order to supplement the select transistors, a conductive layer 20-*d* is provided in the Y direction of the conductive layer 20-0 of the block BLK0, and memory pillars MP are disposed between the conductive layers 20-0 and 20-*d*. A series of select transistors in the X direction are provided at the portions where the conductive layer 20-*d* intersects with the memory pillars MP. In addition, the select gate line SGD7 and the conductive layer 20-*d* are electrically connected to each other by an upper layer wire W1 via, for example, contact plugs. Thus, the select transistors provided at the portions where the conductive layer 20-*d* interests with the memory pillars MP are used as the select transistors in the select gate line SGD7.

Hereinbelow, the configuration of the boundary of the blocks BLK1 and BLK2 will be described.

As illustrated in FIG. 18, the blocks BLK1 and BLK2 are arranged adjacent to each other in the Y direction. In the boundary of the blocks BLK1 and BLK2, the conductive layer 20-15 of the block BLK1 and the conductive layer 20-0 of the block BLK2 are disposed. Conductive layers 20-*e* and 20-*d* that extend in the X direction are provided between the conductive layers 20-15 and 20-0. Memory trenches MST are disposed between the conductive layers 20-15 and 20-*e*, between the conductive layers 20-0 and 20-*d*, and between the conductive layers 20-*e* and 20-*d*.

Here, since no memory pillars MP are disposed between the conductive layer 20-15 of the block BLK0 and the conductive layer 20-0 of the block BLK1, the number of select transistors in the select gate line SGD0 of the block BLK1 is reduced by the number of a series of transistors in the X direction, as compared to the number of select transistors in each of the other select gate lines SGD.

Accordingly, in order to supplement the select transistors, a conductive layer 20-*e* is provided in the Y direction of the conductive layer 20-15 of the block BLK1, and memory pillars MP are disposed between the conductive layers 20-15 and 20-*e*. A series of select transistors in the X direction are provided at the portions where the conductive layer 20-*e* intersects with the memory pillars MP. In addition, the select gate line SGD0 and the conductive layer 20-*e* are electrically connected to each other by the upper layer wire W2 via, for example, contact plugs. Thus, the select transistors provided at the portions where the conductive layer 20-*e* intersects with the memory pillars MP are used as the select transistors in the select gate line SGD0.

Figure 19:
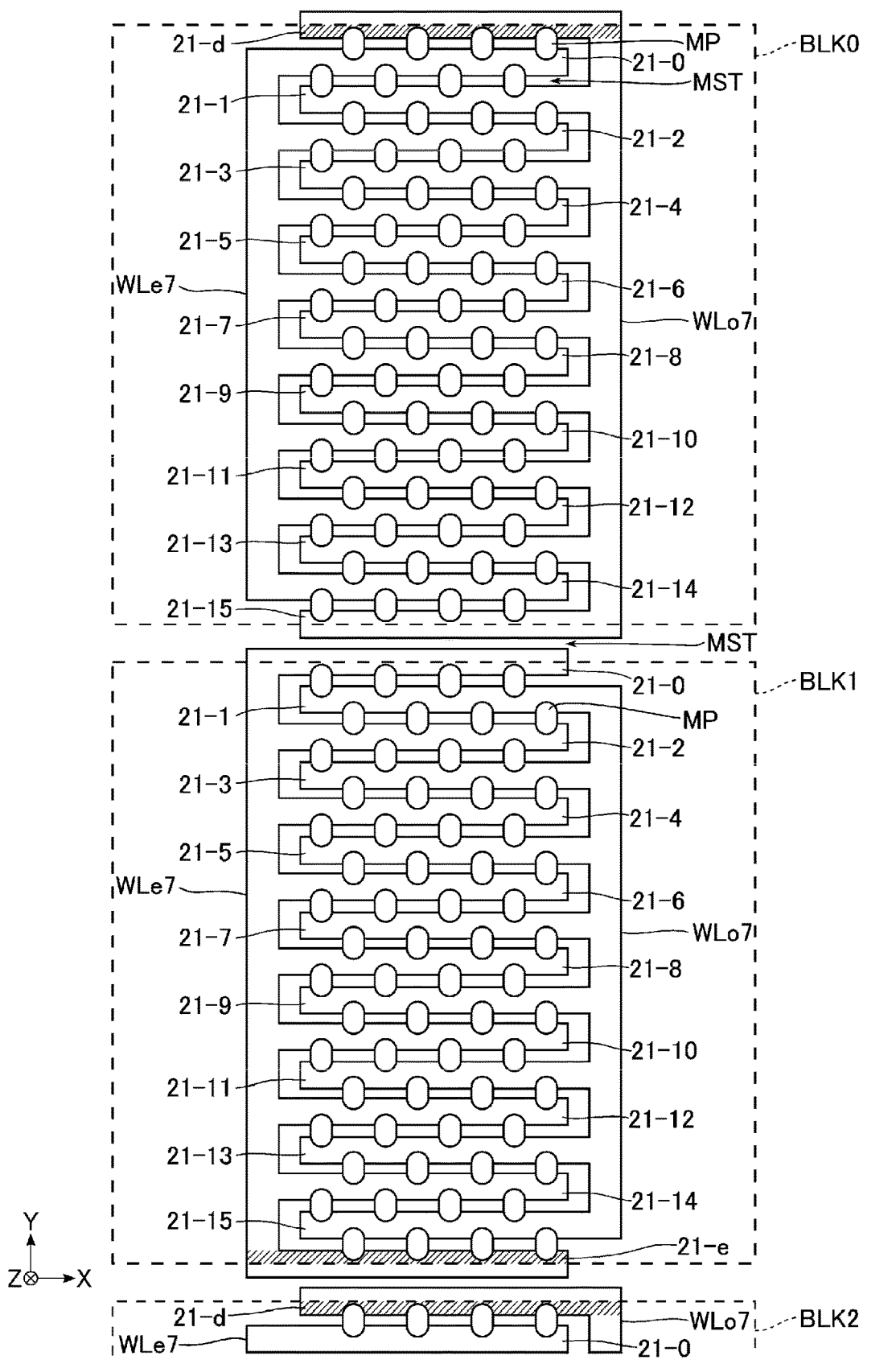
FIG. 19 is a planar layout of memory pillars arranged in a block and word lines connected to the memory pillars according to the fifth embodiment.

Next, the configuration of the word lines WL in the blocks BLK0 and BLK1 will be described. FIG. 19 is a planar layout of the memory pillars MP arranged in the blocks BLK0 and BLK1 and the word lines WLe7 and WLo7 connected to the memory pillars MP.

The configuration of the memory pillars MP, the word lines WLe7 and WLo7 in the portions excluding the boundary of the blocks BLK, and the memory trenches MST in each of the blocks BLK0 and BLK1 is similar to that in the first embodiment.

Hereinbelow, the configuration of the boundary of the blocks BLK0 and BLK1 will be described.

As illustrated in FIG. 19, the blocks BLK0, BLK1, and BLK2 are arranged adjacent to each other in the Y direction. In the boundary of the blocks BLK0 and BLK1, the conductive layer 21-15 of the block BLK0 and the conductive layer 21-0 of the block BLK1 are disposed.

A memory trench MST is disposed between the conductive layers 21-15 and 21-0. In the fourth embodiment described above, the multiple dummy memory pillars MPb are arranged on the memory trench MST between the conductive layers 21-15 and 20-0. However, in the fifth embodiment, no dummy memory pillars MPb or memory pillars MP are arranged.

Here, since no memory pillars MP are disposed between the conductive layer 21-15 of the block BLK0 and the conductive layer 21-0 of the block BLK1, the number of operable memory cell transistors in the word line WLo7 of the block BLK0 is reduced by the number of memory cell transistors in a series of memory pillars in the X direction. That is, the number of operable memory cell transistors in the string unit SU7 is smaller than the number of operable memory cell transistors in each of the other string units SU.

Accordingly, in order to supplement the memory cell transistors, a conductive layer 21-*d* that extends in the X direction is provided in the Y direction of the conductive layer 21-0 of the block BLK0. The conductive layer 21-*d* is electrically connected to the conductive layers 21-1, 21-3, 21-5, . . . , and 21-15 at the other end in the X direction, and functions as the word line WLo7. Memory pillars MP are disposed between the conductive layers 21-0 and 21-*d*.

A series of memory cell transistors in the X direction are provided at the portions where the conductive layer 21-*d* intersects with the memory pillars MP. The memory cell transistors are used as the operable memory cell transistors of the string unit SU7.

Hereinbelow, the configuration of the boundary of the blocks BLK1 and BLK2 will be described.

As illustrated in FIG. 19, the blocks BLK1 and BLK2 are arranged adjacent to each other in the Y direction. In the boundary of the blocks BLK1 and BLK2, the conductive layer 21-15 of the block BLK1 and the conductive layer 21-0 of the block BLK2 are disposed. Conductive layers 21-*e* and 21-*d* that extend in the X direction are provided between the conductive layers 21-15 and 21-0.

Memory trenches MTS are disposed between the conductive layers 21-15 and 21-*e*, between the conductive layers 21-0 and 21-*d*, and between the conductive layers 21-*e* and 21-*d*.

Here, since no memory pillars MP are provided between the conductive layer 21-15 of the block BLK0 and the conductive layer 21-0 of the block BLK1, the number of operable memory cell transistors in the word line WLe7 of the block BLK1 is reduced by the number of memory cell transistors in a series of memory pillars in the X direction. That is, the number of operable memory cell transistors in the string unit SU0 is smaller than the number of operable memory cell transistors in each of the other string units SU.

Accordingly, in order to supplement the memory cell transistors, a conductive layer 21-*e* that extends in the X direction is provided in the Y direction of the conductive layer 21-15 of the block BLK1. The conductive layer 21-*e* is electrically connected to the conductive layers 21-0, 21-2, 21-4, . . . , and 21-14 atone end in the X direction, and functions as the word line WLe7. Memory pillars MP are disposed between the conductive layers 21-15 and 21-e.

A series of memory cell transistors in the X direction are provided at the portions where the conductive layer 21-e intersects with the memory pillars MP. The memory cell transistors are used as the operable memory cell transistors in the string unit SU0. The other configurations are the same as those of the first embodiment.

In addition, a conductive layer 21-d is provided between the conductive layer 21-0 of the block BLK2 and the conductive layer 21-e. Memory pillars MP are disposed between the conductive layers 21-0 and 21-d. A series of memory cell transistors in the X direction are provided at the portions where the conductive layer 21-d intersects with the memory pillars MP. The memory cell transistors are used to supplement the shortage of the memory cell transistors provided in the conductive layer 21-15 (string unit SU7) of the block BLK2.

5.2 Effects of Fifth Embodiment

According to the fifth embodiment, it is possible to provide a semiconductor memory device capable of improving the operation reliability.

As described above, no memory pillars MP are provided, and only memory trenches MST are provided between the conductive layer 21-15 of the block BLK0 and the conductive layer 21-0 of the block BLK1 and between the conductive layers 21-e and 21-d, in the boundary of the blocks BLK. Each memory trench MST is an insulating area, and separates the conductive layers 21-15 and 21-0 or the conductive layers 21-e and 21-d from each other, in an insulating manner. That is, the fifth embodiment has the configuration from which the configuration of the fourth embodiment is deleted, that is, the memory pillars MP disposed between the conductive layer 21-15 of the block BLK0 and the conductive layer 21-0 of the block BLK1 and between the conductive layers 21-e and 21-d in the boundary of the blocks BLK1 and BLK2 are deleted.

In the configuration described above, as in the fourth embodiment, for example, when write, read, and erase operations are performed on the string unit SU7 of the block BLK0, voltages defined in the respective operations are applied to the conductive layers 21-15. In this case, since no memory pillars MP are disposed between the conductive layers 21-15 and 21-10 in the block boundary, no disturbance occurs in the memory cell transistors at the time of the write, read, and erase operations, that is, the voltages defined in the respective operations cause no disturbance in the memory cell transistors near the block boundary.

Similarly, when write, read, and erase operations are performed on the string unit SU0 of the block BLK1, voltages defined in the respective operations are applied to the conductive layer 21-0. In this case, since no memory pillars MP are disposed between the conductive layers 21-15 and 21-10 in the block boundary, no disturbance occurs in the memory cell transistors at the time of the write, read, and erase operations, that is, the write, read, and erase operations on the adjacent memory cells cause no disturbance in the memory cell transistors near the block boundary.

As described above, in the fifth embodiment, it is possible to reduce the disturbance that occurs in the memory cell transistors disposed at the boundary of the blocks BLK at the time of write, read, and erase operations. As a result, according to the fifth embodiment, it is possible to improve the operation reliability of the semiconductor memory device.

In addition, in the fifth embodiment, since the dummy word lines of the second and third embodiments are not disposed in the boundary of the blocks BLK, the arrangement of the memory cells may be highly densified.

6. Modifications and Others

In the embodiments described above, the NAND type flash memory has been described as the semiconductor memory device. However, the present disclosure is not limited to the NAND type flash memory, and may be applied to other general semiconductor memories having memory pillars MP, and furthermore, may be applied to various memory devices other than semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first block and a second block each including a plurality of memory cell transistors and arranged adjacent to each other in a first direction,
   wherein each of the first and second blocks includes:
      a plurality of first conductive layers that extend in a second direction orthogonal to the first direction and are arranged relative to each other along the first direction;
      a plurality of first insulating layers that are provided between the first conductive layers and extend in a third direction orthogonal to both of the first and second directions;
      a plurality of first pillars that are provided across two of the plurality of first conductive layers with one of the plurality of first insulating layers interposed therebetween, extend in the third direction, and are arranged relative to each other along the second direction; and
      a plurality of first transistors that are provided by the plurality of first pillars and the plurality of first conductive layers, and wherein
   at least a first one of the plurality of first conductive layers provided at an end of the first block in the first direction is electrically connected to at least a second one of the plurality of first conductive layers provided at an end of the second block in the first direction.

2. The semiconductor memory device according to claim 1, further comprising:
   a second insulating layer that is provided between the at least first one of the first conductive layers and the at least second one of the first conductive layers, and extends in the third direction, in a boundary region of the first and second blocks.

3. The semiconductor memory device according to claim 1, further comprising:
   a plurality of bit lines that are connected to the plurality of first pillars, respectively, and extend in the first direction;

a second insulating layer that is provided between the at least first one of the first conductive layers and the at least second one of the first conductive layers, and extends in the third direction, in a boundary region of the first and second blocks; and a plurality of second pillars that are provided across two of the plurality of first conductive layers with a second insulating layer interposed therebetween, extend in the third direction, and are arranged relative to each other along the second direction such that the second pillars are not connected to the bit lines.

4. The semiconductor memory device according to claim 1, further comprising:

a plurality of second conductive layers that extend in the second direction, are provided between the first conductive layers, and are arranged relative to each other along the first direction; and a plurality of second transistors provided by the first pillars and the second conductive layers.

5. The semiconductor memory device according to claim 1, wherein the plurality of first transistors include the plurality of memory cell transistors provided in the third direction, and a plurality of select transistors connected to the plurality of memory cell transistors, and the first conductive layers are connected to gates of the select transistors.

6. The semiconductor memory device according to claim 1, wherein the two first conductive layers, with the first insulating layer interposed therebetween, are connected to each other at one end or the other end in the second direction while another one of the plurality of first conductive layers is interposed between the two first conductive layers.

7. The semiconductor memory device according to claim 1, wherein a page which is at least one of a write unit or a read unit is configured by a sum of one or more of the memory cell transistors in the first pillars that intersect with the first conductive layer provided at one end of the first block in the first direction, and one or more of the memory cell transistors in the first pillars that intersect with the first conductive layer provided at the other end of the first block in the first direction.

8. The semiconductor memory device according to claim 3, wherein either one-side ends or the other-side ends of the second pillars are not electrically connected to a wire layer.

9. The semiconductor memory device according to claim 3, wherein one or more of the memory cell transistors in the second pillars are not used for a write operation.

10. The semiconductor memory device according to claim 1, wherein each of the first and second blocks is a unit in which data stored in the memory cell transistors is collectively erased in which data stored in the memory cell transistors is erased.

* * * * *